US009147652B2

(12) United States Patent
Okamoto et al.

(10) Patent No.: US 9,147,652 B2
(45) Date of Patent: Sep. 29, 2015

(54) LAYOUT STRUCTURE OF STANDARD CELL, STANDARD CELL LIBRARY, AND LAYOUT STRUCTURE OF SEMICONDUCTOR INTEGRATED CIRCUIT

(71) Applicant: PANASONIC CORPORATION, Osaka (JP)

(72) Inventors: Nana Okamoto, Osaka (JP); Masaki Tamaru, Kyoto (JP); Hidetoshi Nishimura, Osaka (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 14/281,662

(22) Filed: May 19, 2014

(65) Prior Publication Data
US 2014/0252653 A1      Sep. 11, 2014

Related U.S. Application Data

(60) Division of application No. 12/905,873, filed on Oct. 15, 2010, now Pat. No. 8,766,322, which is a continuation of application No. PCT/JP2009/001188, filed on Mar. 17, 2009.

(30) Foreign Application Priority Data

Apr. 25, 2008 (JP) ................................. 2008-115188

(51) Int. Cl.
*H01L 27/118*      (2006.01)
*H01L 23/498*      (2006.01)
*H01L 27/02*       (2006.01)

(52) U.S. Cl.
CPC ...... *H01L 23/49827* (2013.01); *H01L 27/0207* (2013.01); *H01L 27/11807* (2013.01); *H01L 2924/0002* (2013.01)

(58) Field of Classification Search
CPC ................ H01L 27/02; H01L 27/0207; H01L 27/11526; H01L 27/11529
USPC .................... 257/204, 206, E27.013, E29.027
See application file for complete search history.

(56) References Cited

U.S. PATENT DOCUMENTS 5,304,835 A * 4/1994 Imai et al. ..................... 257/390
7,349,240 B2    3/2008 Oki
(Continued)

FOREIGN PATENT DOCUMENTS

JP         04-105359 A      4/1992
JP         06-085080 A      3/1994
(Continued)

OTHER PUBLICATIONS

International Search Report issued in International Application No. PCT/JP2009/001188 mailed Apr. 14, 2009, with English translation, 2 pgs.

*Primary Examiner* — Brook Kebede
(74) *Attorney, Agent, or Firm* — McDermott Will & Emery LLP

(57) ABSTRACT

In a layout structure of a standard cell including off transistors 126, 127 unnecessary for logic operation of a circuit, dummy via contacts 116, 117 are disposed on impurity diffusion regions 103, 106 of the off transistors 126, 127, respectively. Dummy metal interconnects 122, 123 are connected to the dummy via contacts 116, 117, respectively. Thus, variations in the density of via contacts, which are one of causes lowering the production yield of semiconductor integrated circuits, is reduced, improving manufacturing defects of the via contacts.

8 Claims, 34 Drawing Sheets

(56) References Cited

U.S. PATENT DOCUMENTS

| | | |
|---|---|---|
| 2001/0030894 A1* | 10/2001 | Braun et al. .................. 365/200 |
| 2004/0016055 A1 | 1/2004 | Lamy |
| 2004/0075470 A1 | 4/2004 | Oodaira et al. |
| 2005/0205894 A1 | 9/2005 | Sumikawa et al. |
| 2007/0101306 A1 | 5/2007 | Bowers et al. |
| 2007/0221957 A1 | 9/2007 | Kitajima et al. |
| 2007/0262454 A1 | 11/2007 | Shibata |

FOREIGN PATENT DOCUMENTS

| | | |
|---|---|---|
| JP | 07-273300 A | 10/1995 |
| JP | 2006-100307 A | 4/2006 |
| JP | 2007-129030 A | 5/2007 |
| JP | 2008-047857 A | 2/2008 |

* cited by examiner

VDD

Dummy Via Contact
520

VSS

520

LAYOUT STRUCTURE OF STANDARD CELL, STANDARD CELL LIBRARY, AND LAYOUT STRUCTURE OF SEMICONDUCTOR INTEGRATED CIRCUIT

CROSS-REFERENCE TO RELATED APPLICATION

This is a Divisional application of application Ser. No. 12/905,873, filed on Oct. 15, 2010, now U.S. Pat. No. 8,766,322, which is a continuation of PCT International Application PCT/JP2009/001188 filed on Mar. 17, 2009, which claims priority to Japanese Patent Application No. 2008-115188 filed on Apr. 25, 2008. The disclosures of these applications including the specifications, the drawings, and the claims are hereby incorporated by reference in their entirety.

BACKGROUND

The present disclosure relates to standard cells effective in reducing manufacturing defects of via contacts, standard cell libraries, and layout structures of semiconductor integrated circuits.

First, definitions of terms used in the specification are provided below. The term "dummy metal interconnect" refers to a metal interconnect other than metal interconnects which are not dummy. As to the term "metal interconnect which is not dummy," if a circuit can no longer accomplish preferable logic operation when the entire region of a metal interconnect is removed to break the connection to a layer under or over a via contact connected to the metal interconnect, the metal interconnect is defined as a metal interconnect which is not dummy. Note that in the specification, a metal interconnect which is not dummy is simply referred to as a "metal interconnect."

The term "dummy via contact" refers to a via contact which is not connected to a metal interconnect other than dummy metal interconnects. The presence or absence of a dummy via contact is irrelevant to accomplishment of preferable logic operation of a circuit.

The term "gate interconnect" refers to an interconnect on a shallow trench isolation (STI) region, where the gate interconnect is formed in the same layer as that of the gate of a transistor made of, for example, polysilicon, is made of the same material as that of the gate of the transistor, and is connected to the gate of the transistor in the same layer.

The term "active gate" refers to a concept including a gate of a transistor and a gate interconnect in combination.

The term "dummy gate" refers to an interconnect on a shallow trench isolation region, where the interconnect is formed in the same layer as that of an active gate, is made of the same material as that of the active gate, but is not connected to the active gate in the same layer.

The term "gate region" refers to a concept including an active gate and a dummy gate in combination.

The term "off transistor" refers to a transistor kept in an off state in which the gate potential of a p-channel transistor is fixed at a power supply potential, or the gate potential of an n-channel transistor is fixed at a ground potential.

Generally, variations in the density of via contacts closely relate to manufacturing defects of the via contacts. The manufacturing defects of the via contacts are one of causes reducing the fabrication yield of semiconductor integrated circuits. Thus, various methods to overcome the above problems have been proposed. For example, in Japanese Patent Publication No. H6-85080, as a portion of a chip where via contacts are sparsely distributed, attention is focused on a shallow trench isolation region where no transistors are disposed. Dummy via contacts are disposed on the shallow trench isolation region to eliminate the non-uniformity in distribution of disposition of the via contacts. Moreover, Japanese Patent Publication No. 2007-129030 describes a configuration in which a dummy via contact having the same potential as that of a via contact is disposed through shared use of a lower layer to which the via contact is connected.

SUMMARY

However, the technique described in Japanese Patent Publication No. H6-85080 has the following problems. In a miniaturization technique of recent years, a layout structure in which gates are uniformly spaced from each other is general in order to reduce gate size variations of transistors. It is not only the gates of the transistors that are uniformity spaced from each other. As illustrated in FIG. 37, a dummy gate 2006 is disposed on a shallow trench isolation region 2007, and the space between the dummy gate 2006 and an active gate region 2005 of a transistor accomplishing preferable logic operation of a circuit also has a uniform, predetermined space t. If the technique described in Japanese Patent Publication No. H6-85080 is used under this condition, the predetermined space t can no longer be ensured. Moreover, it is also possible to dispose a dummy via contact on the shallow trench isolation region on the right of the dummy gate 2006 of FIG. 37 under the condition that the dummy gate 2006 is ensured. However, in most cases, an impurity diffusion region or a gate region is disposed on the shallow trench isolation on the right of the dummy gate 2006 to accomplish an area reduction which is an important factor in a layout of a standard cell. Thus, it is not possible under present circumstances to ensure a shallow trench isolation region sufficient for disposition of the dummy via contact. Therefore, the technique of disposing a dummy via contact on a shallow trench isolation region described in Japanese Patent Publication No. H6-85080 scarcely improves the non-uniform density of the via contacts in a layout structure of a standard cell most of which is occupied by impurity diffusion regions and gate regions. Note that in FIG. 37, reference numerals 2001, 2002 denote impurity diffusion regions, reference numeral 2003 denotes a metal interconnect connected onto the impurity diffusion region 2002 via a via contact 2004.

Moreover, the technique described in Japanese Patent Publication No. 2007-129030 is to provide a dummy via contact be adjacent to a via contact necessary for circuit operation. However, if there is a region sufficient for disposition of a dummy via contact, a method practically chosen is to dispose an additional via contact in this region to increase the number of via contacts used for actual operation so that connection to a metal interconnect is ensured. Thus, there is generally no region sufficient for disposition of a dummy via contact. Furthermore, Japanese Patent Publication No. 2007-129030 describes only the technique of disposing a dummy via contact having the same potential as that of a via contact necessary for logic operation, and this technique does not address a portion where the via contact is not disposed originally. Therefore, it is not possible to adjust variations in the density of via contacts in, for example, an impurity diffusion region, a dummy impurity diffusion region, and a dummy gate forming an off transistor, and a portion where series transistors sharing the impurity diffusion region are densely disposed. Moreover, it is supposed that via contacts or dummy via contacts may contrarily be disposed densely due to the adjustment only in terms of the same potential.

It is an objective of the present invention to dispose as many dummy via contacts as possible in a sparse region in order to solve the problems discussed above, thereby reducing variations in the density of via contacts to reduce manufacturing defects of the via contacts.

To achieve the above objective, in the present invention, a dummy via contact is disposed in a sparse region which is an impurity diffusion region of an off transistor unnecessary for logic operation of a circuit, a dummy impurity diffusion region, a region on the gate of a transistor, a region on a dummy gate, or a shared impurity diffusion region included in transistors connected to each other in series.

Specifically, an example layout structure of a standard cell of the present invention may include: an off transistor including impurity diffusion regions; and a dummy via contact on at least one of the impurity diffusion regions.

An example layout structure of a standard cell of the present invention may include: dummy impurity diffusion regions; and a dummy via contact on at least one of the dummy impurity diffusion regions.

An example layout structure of a standard cell of the present invention may include: transistors; and a dummy via contact on a gate of at least one of the transistors.

An example layout structure of a standard cell of the present invention may include: dummy gates; and a dummy via contact on at least one of the dummy gates.

An example layout structure of a standard cell of the present invention may have a first transistor, a second transistor, and a third transistor which are connected to each other in series, the first transistor and the second transistor sharing a first impurity diffusion region, and the second transistor and the third transistor sharing a second impurity diffusion region, wherein at least one dummy via contact is provided on any one of the first impurity diffusion region and the second impurity diffusion region, and the dummy via contact is connected to the impurity diffusion region.

In the layout structure of the standard cell of the present invention, the dummy via contact may be connected to a dummy metal interconnect.

In the layout structure of the standard cell of the present invention, the standard cell may be a NAND circuit having three or more inputs, and the first to third transistors may be n-channel transistors.

In the layout structure of the standard cell of the present invention, the standard cell may be a NOR circuit having three or more inputs, and the first to third transistors may be p-channel transistors.

In the layout structure of the standard cell of the present invention, the standard cell may be an inverter circuit, the first to third transistors may be n-channel transistors or p-channel transistors.

In the layout structure of the standard cell of the present invention, the at least one dummy via contact includes a plurality of dummy via contacts in a dummy metal interconnect region.

An example layout structure of a standard cell of the present invention may have a first transistor and a second transistor which are connected to each other in series, the first transistor and the second transistor sharing an impurity diffusion region, wherein at least one dummy via contact is provided on the impurity diffusion region, and the dummy via contact is connected to the impurity diffusion region.

In the layout structure of the standard cell of the present invention, the standard cell may be a NAND circuit having two or more inputs, and the first transistor may be an n-channel transistor.

In the layout structure of the standard cell of the present invention, the standard cell may be a NOR circuit having two or more inputs, and the first transistor may be a p-channel transistor.

In the layout structure of the standard cell of the present invention, the standard cell may be an inverter circuit, and the first transistor may be an n-channel transistor or a p-channel transistor.

An example layout structure of a standard cell of the present invention may have a first transistor, a second transistor, and a third transistor which are connected to each other in series, the first transistor and the second transistor sharing a first impurity diffusion region, and the second transistor and the third transistor sharing a second impurity diffusion region, wherein at least one dummy via contact is provided on at least one of the first impurity diffusion region and the second impurity diffusion region, and the dummy via contact is connected to the impurity diffusion region.

In the layout structure of the standard cell of the present invention, one of the dummy via contacts may be covered with a dummy metal interconnect.

In the layout structure of the standard cell of the present invention, the standard cell may be a NAND circuit having three or more inputs, and the first to third transistors may be n-channel transistors.

In the layout structure of the standard cell of the present invention, the standard cell may be a NOR circuit having three or more inputs, and the first to third transistors may be p-channel transistors.

In the layout structure of the standard cell of the present invention, the standard cell may be an inverter circuit, and the first to third transistors may be n-channel transistors or p-channel transistors.

In the layout structure of the standard cell of the present invention, the at least one dummy via contact includes a plurality of dummy via contacts in a dummy metal interconnect region.

An example standard cell library of the present invention may include: a standard cell having the layout structure described above.

An example layout structure of a semiconductor integrated circuit of the present invention may include: a standard cell having any one of the layout structures described above, wherein the standard cell is mounted on an LSI together with other standard cells.

As described above, in the present invention, a dummy via contact is disposed on an impurity diffusion region of an off transistor unnecessary for logic operation of a circuit, a dummy impurity diffusion region, the gate of a transistor, a dummy gate, or a shared impurity diffusion region included in transistors connected to each other in series. Thus, it is not required to necessarily dispose a dummy via contact in a specific portion as in the conventional layout, so that it is possible to dispose the dummy via contact in consideration of layout efficiency. Therefore, the difference in the density of via contacts can be reduced without increasing the layout area, and manufacturing defects of the via contacts can be reduced, so that it is possible to improve the production yield of LSIs.

ADVANTAGES OF THE INVENTION

As described above, according to the layout structure of the standard cell of the present invention, a dummy via contact can be disposed in consideration of layout efficiency, the difference in the density of via contacts can be reduced without increasing the layout area, and manufacturing defects of the via contacts can be reduced, so that it is possible to improve the production yield of LSIs.

DETAILED DESCRIPTION

Embodiments of layout structures of standard cells, standard cell libraries, and layout structures of semiconductor integrated circuits according to the present invention will be described in detail below based on the drawings.

First Embodiment

FIGS. 1, 2, 3, and 4 are simplified views of layout structures of standard cells in a first embodiment of the present invention.

Figure 1:
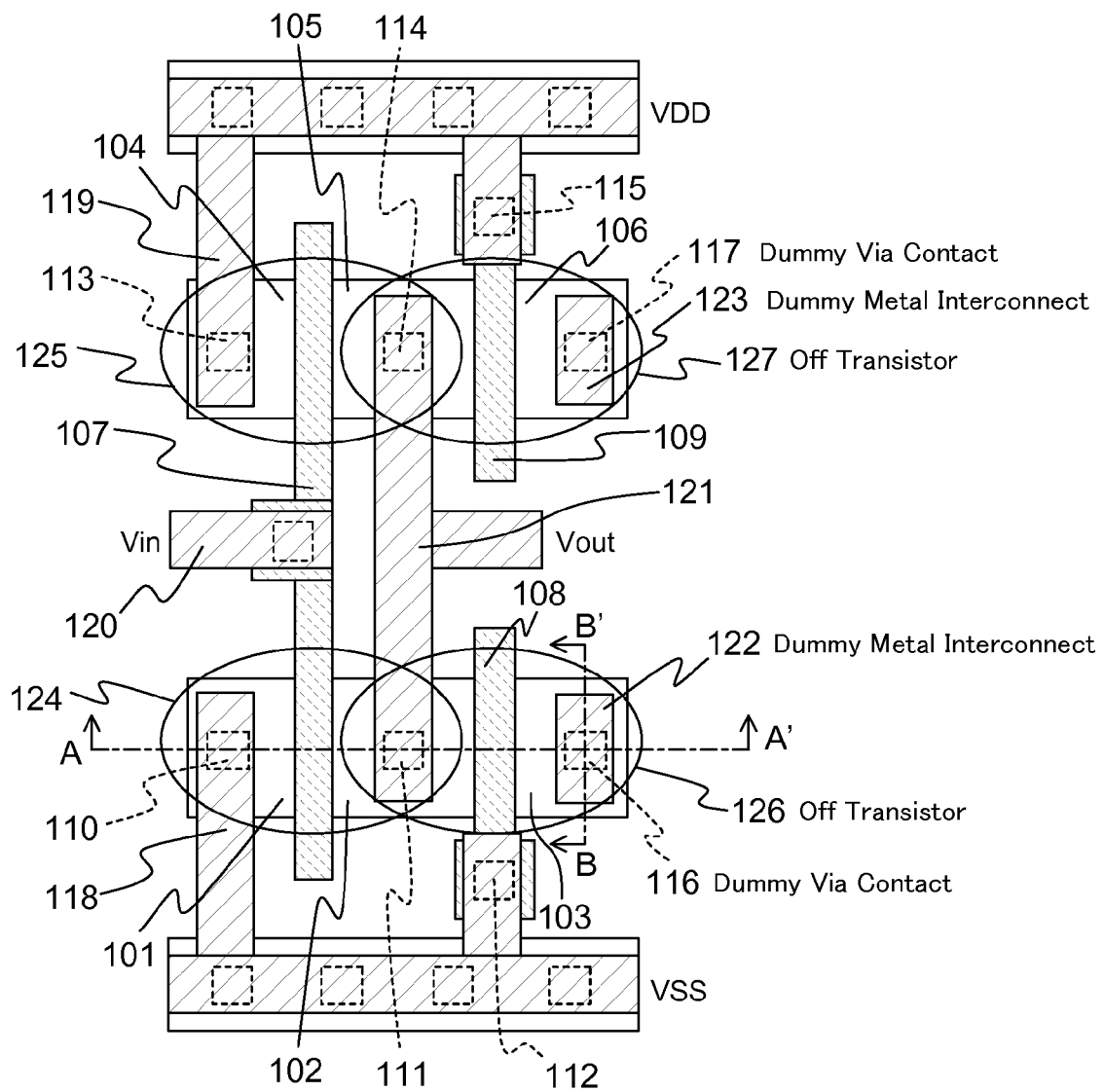
FIG. 1 is a simplified view of a layout structure of a standard cell in a first embodiment of the present invention.
Figure 2:
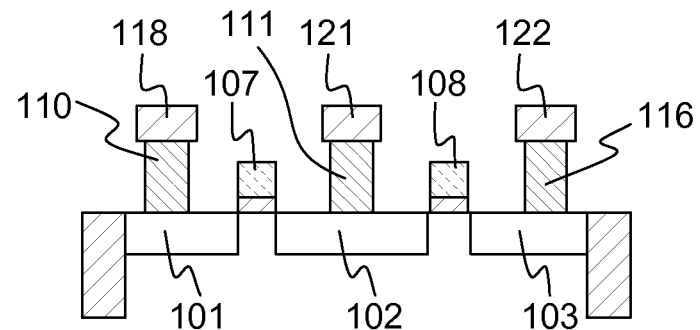
FIG. 2 is a cross-sectional view of the layout structure along the line A-A' of FIG. 1.
Figure 3:
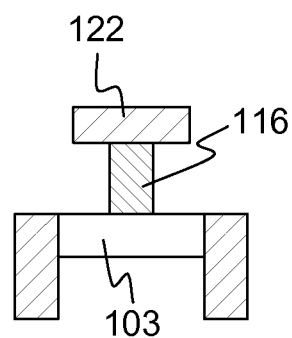
FIG. 3 is a cross-sectional view of the layout structure along the line B-B' of FIG. 1.

In FIGS. 1-3, reference numerals 101-106 denote impurity diffusion regions, reference numerals 107-109 denote active gate regions, reference numerals 110-115 denote via contacts, inference numerals 116-117 denote dummy via contacts, reference numerals 118-121 denote metal interconnects, and reference numerals 122-123 denote dummy metal interconnects.

The impurity diffusion regions 101, 102 and the active gate region 107 form an n-channel transistor 124. The impurity diffusion regions 104, 105 and the active gate region 107 form a p-channel transistor 125. The n-channel transistor 124, the p-channel transistor 125, the via contacts 110, 111, 113, 114 and the metal interconnects 118-121 form an inverter circuit whose input signal is denoted by Vin, and output signal is denoted by Vout.

An n-channel transistor 126 shares the impurity diffusion region 102 with the n-channel transistor 124, and includes the impurity diffusion regions 102, 103 and the active gate region 108. A ground potential VSS is applied to the n-channel transistor 126 via the metal interconnect 118 and the via contact 112, and thus the n-channel transistor 126 is an off transistor. Moreover, a p-channel transistor 127 shares the impurity diffusion region 105 with the p-channel transistor 125, and includes the impurity diffusion regions 105, 106 and the active gate region 109. A power supply potential VDD is applied to the gate of the p-channel transistor 127 via the metal interconnect 119 and the via contact 115, and thus the p-channel transistor 127 is an off transistor. The off transistors 126, 127 are disposed to improve properties, for example, to substitute dummy gates, and to expand the impurity diffusion regions of the transistors used for actual operation of the circuit.

It will be described with reference to FIG. 1 that the contacts 116-117 are dummy via contacts, and the interconnects 122-123 are dummy metal interconnects.

For example, when the metal interconnect 118 is removed, the ground potential VSS is no longer supplied to the impurity diffusion region 101 through the via contact 110. Thus, it is certain that preferable logic operation can no longer be accomplished. The same holds true for the metal interconnects 119-121. In contrast, even when, for example, the dummy metal interconnect 122 is removed, the logic operation of the inverter circuit is not influenced. The same holds true for the dummy metal interconnect 123. Such metal interconnects whose presence or absence has no influence on the logic operation of the circuit correspond to the dummy metal interconnects defined in the present specification. The contacts 116, 117 connected to the dummy metal interconnects 122, 123 correspond to the dummy via contacts connected only to the dummy metal interconnects 122, 123. Thus, as in the case of the dummy metal interconnects 122, 123, the presence or absence of the dummy via contacts 116, 117 does not influence the logic operation of the inverter circuit.

Next, advantages of the present invention will be described with reference to FIG. 1, and FIGS. 4-9.

Figure 4:
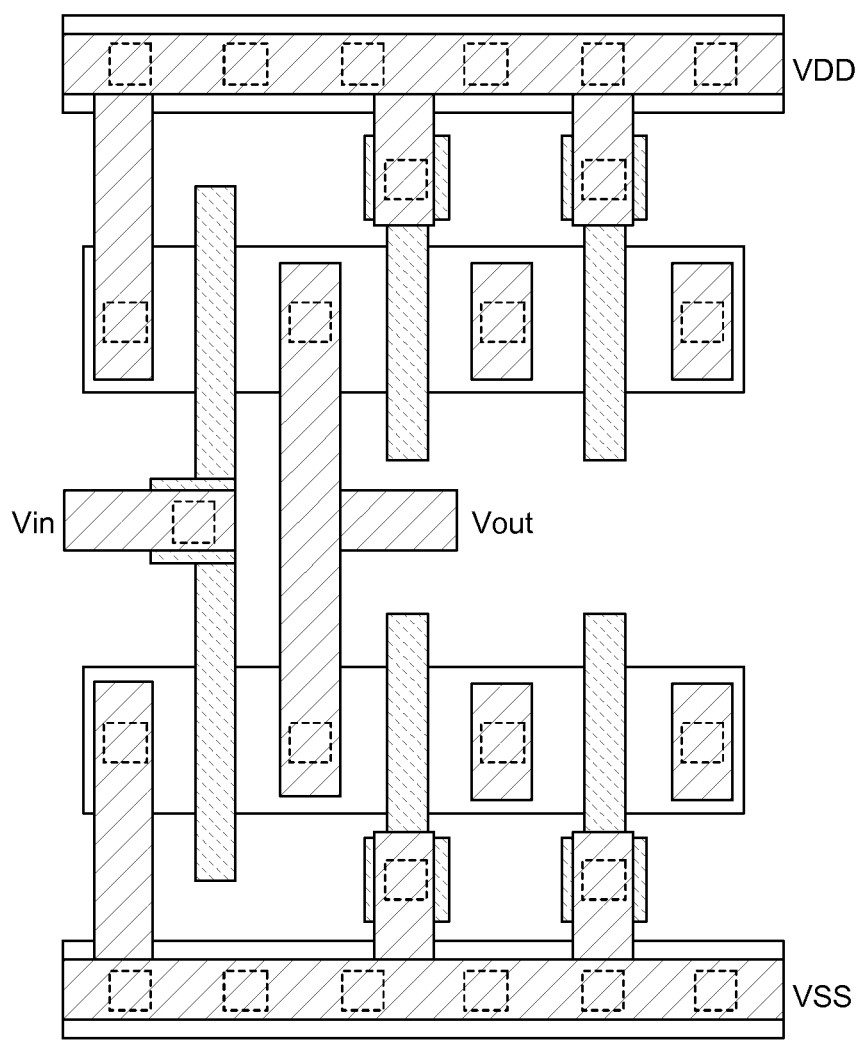
FIG. 4 is a simplified view of another layout structure of the standard cell in the first embodiment.
Figure 5:
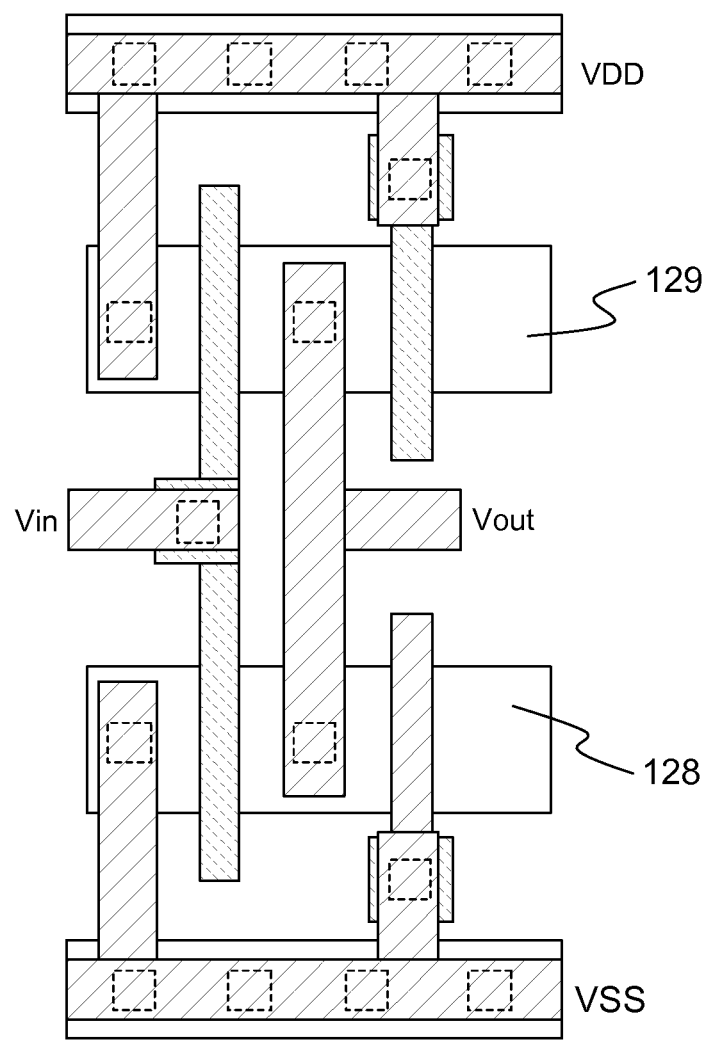
FIG. 5 is a schematic view of a layout structure of a conventional standard cell.
Figure 6:
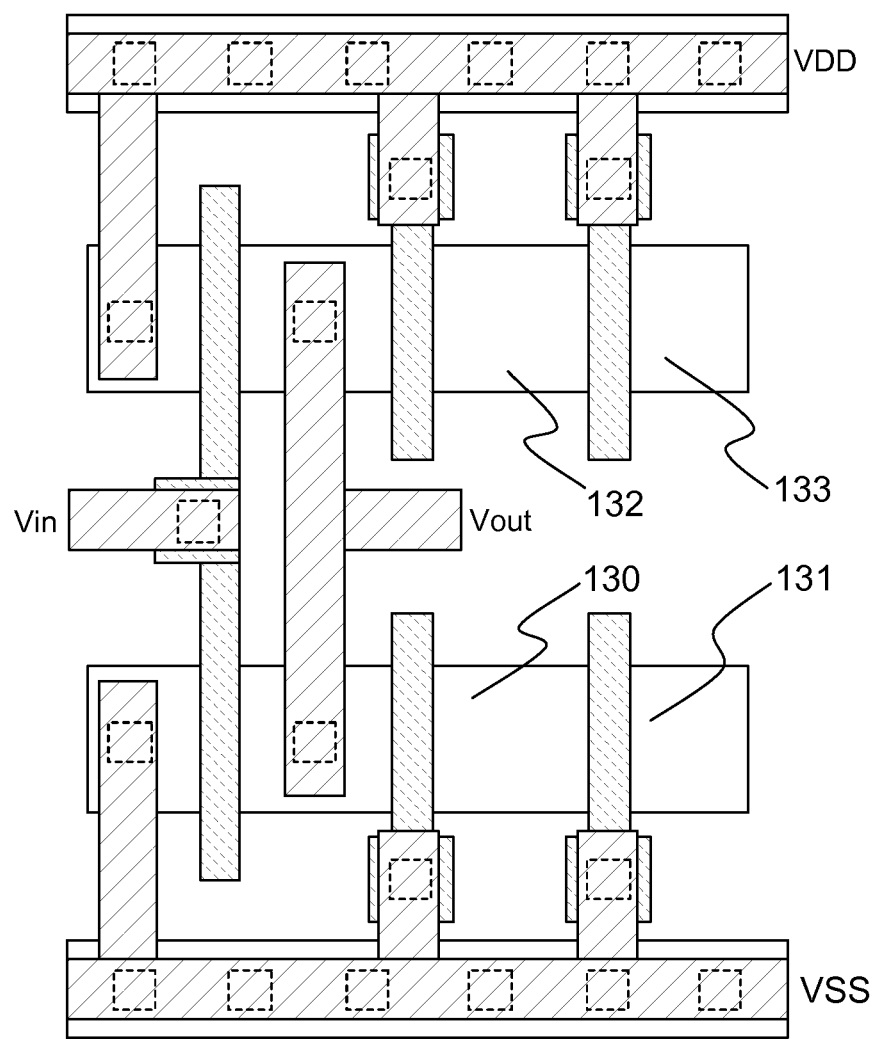
FIG. 6 is a schematic view of another layout structure of the conventional standard cell.

Generally, when off transistors are utilized in a layout, impurity diffusion regions 128-133 are not provided with via contacts connected to these impurity diffusion regions as illustrated in FIGS. 5 and 6. However, when such layout structures are densely provided, or when a plurality of off transistors are provided as illustrated in FIG. 6, variations in the density of the via contacts become large. For this reason, the dummy via contacts 116, 117 are disposed on the impurity diffusion regions 103, 106 on the off transistors on which no via contacts are necessary for logic operation as illustrated in FIGS. 1 and 4, so that it is possible to reduce the variations in the density of the via contacts. Note that the number of off transistors laid out is one in FIG. 1, but an example in which the number of off transistors laid out is two is illustrated in FIG. 4.

Figure 7:
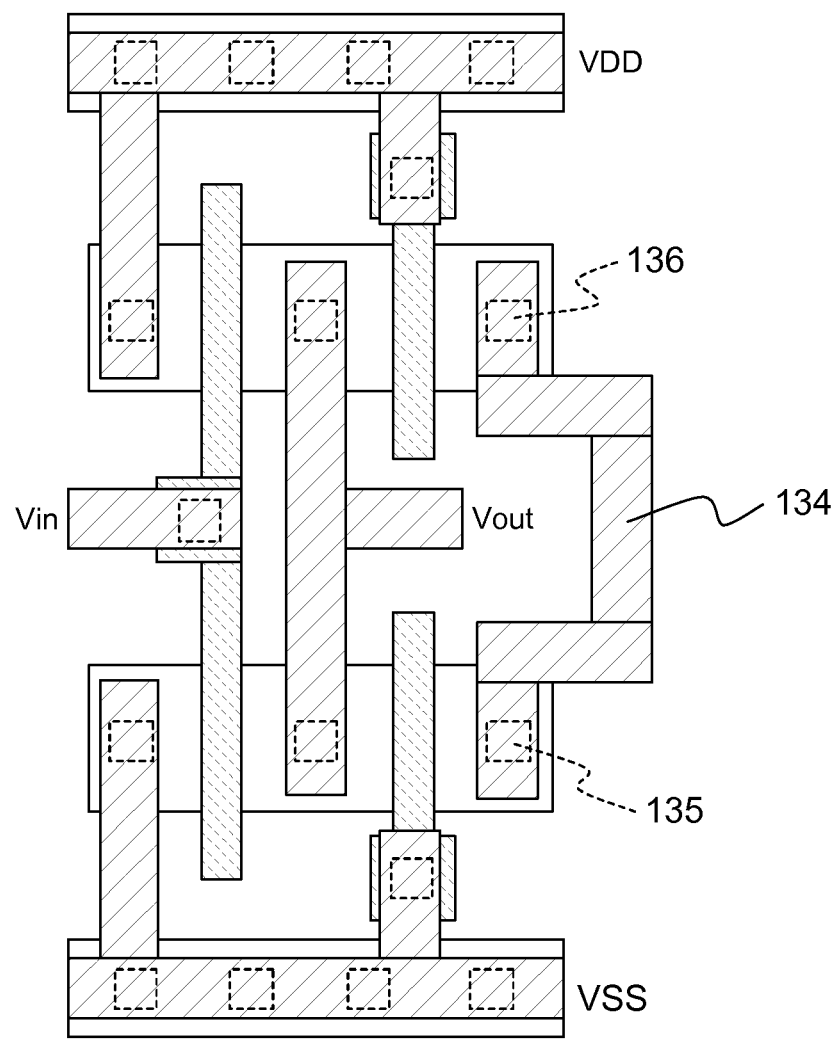
FIG. 7 is a simplified view illustrating a variation of the layout structure of the standard cell in the first embodiment of the present invention.
Figure 8:
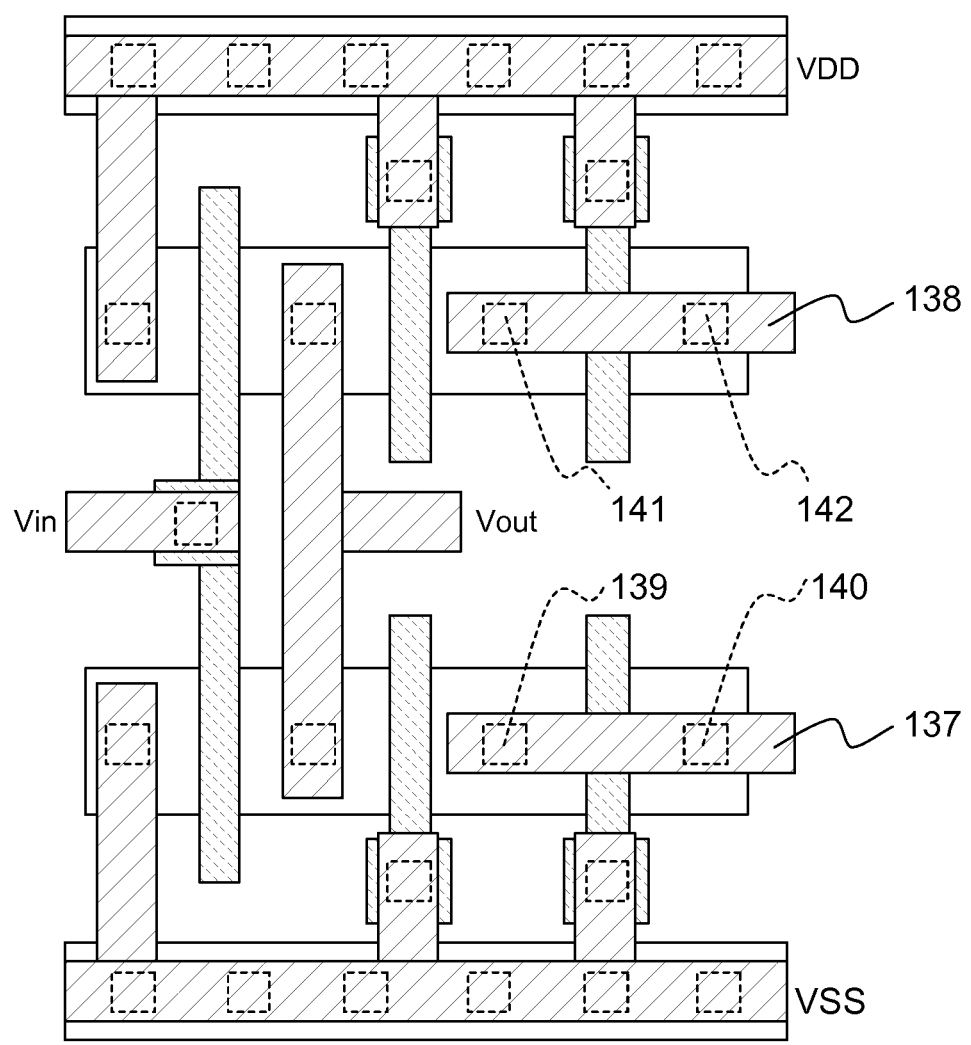
FIG. 8 is a simplified view illustrating another variation of the layout structure of the first embodiment.

Alternatively, dummy via contacts 135, 136 may be connected to each other via a dummy metal interconnect 134 as illustrated in FIG. 7. Alternatively, dummy via contacts 139, 140 may be connected to each other via a dummy metal interconnect 137, and dummy via contacts 141, 142 may be connected to each other via a dummy metal interconnect 138 as illustrated in FIG. 8.

Note that in the present embodiment, the off transistors are adjacent to, for example, the inverter circuit, but the off transistors can be adjacent to any circuit, and of course, the same advantages can be obtained.

Figure 9:
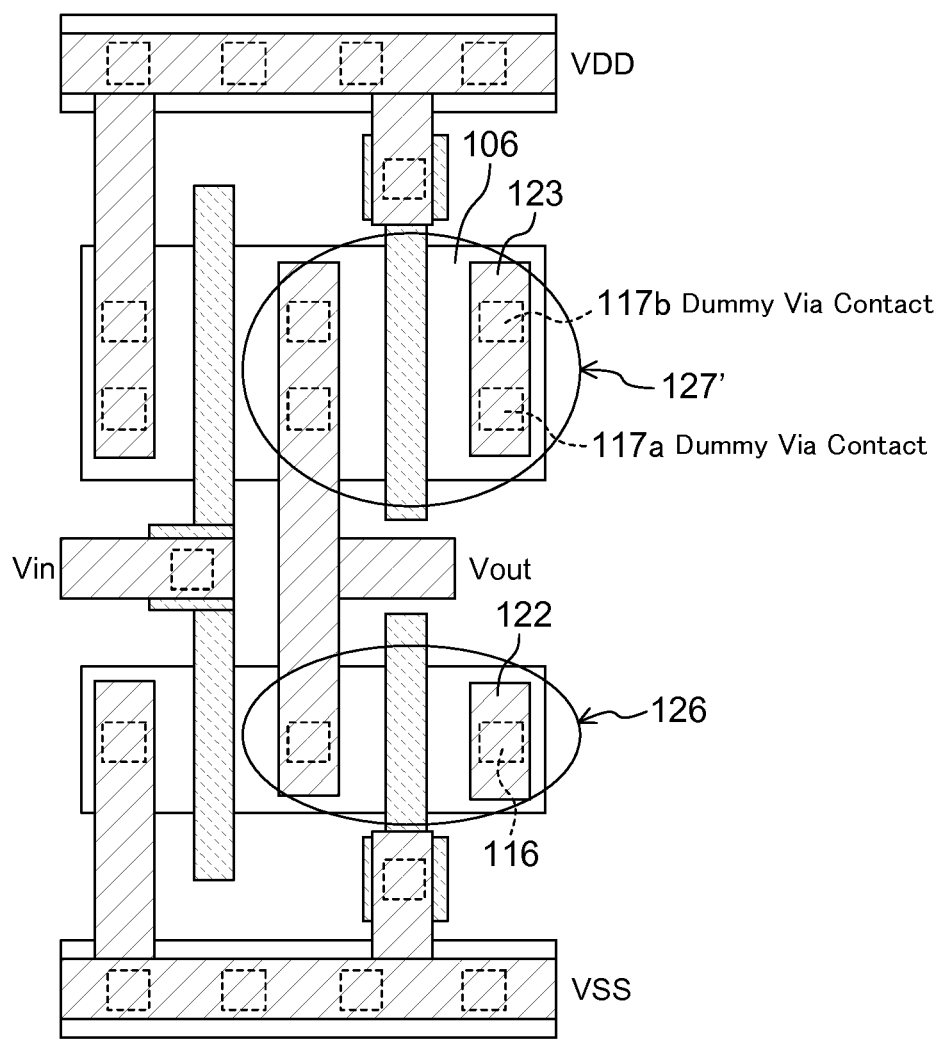
FIG. 9 is a simplified view illustrating yet another variation of the layout structure of the first embodiment.

Alternatively, as illustrated in FIG. 9, it is certain that similar advantages are obtained when a plurality of dummy via contacts 117a, 117b are provided on an impurity diffusion region 106 of an off transistor 127' on which no via contacts are necessary for logic operation. Thus, description of such configurations will be omitted in the following embodiments.

Note that the present embodiment is not necessarily applied to all of the relevant positions, but advantages can be obtained when the present embodiment is implemented only in applicable positions. Thus, it is possible to selectively apply the present embodiment depending on the condition of peripheral layout structures. This similarly applies to the following embodiments, and thus the description is omitted below.

Second Embodiment

Figure 10:
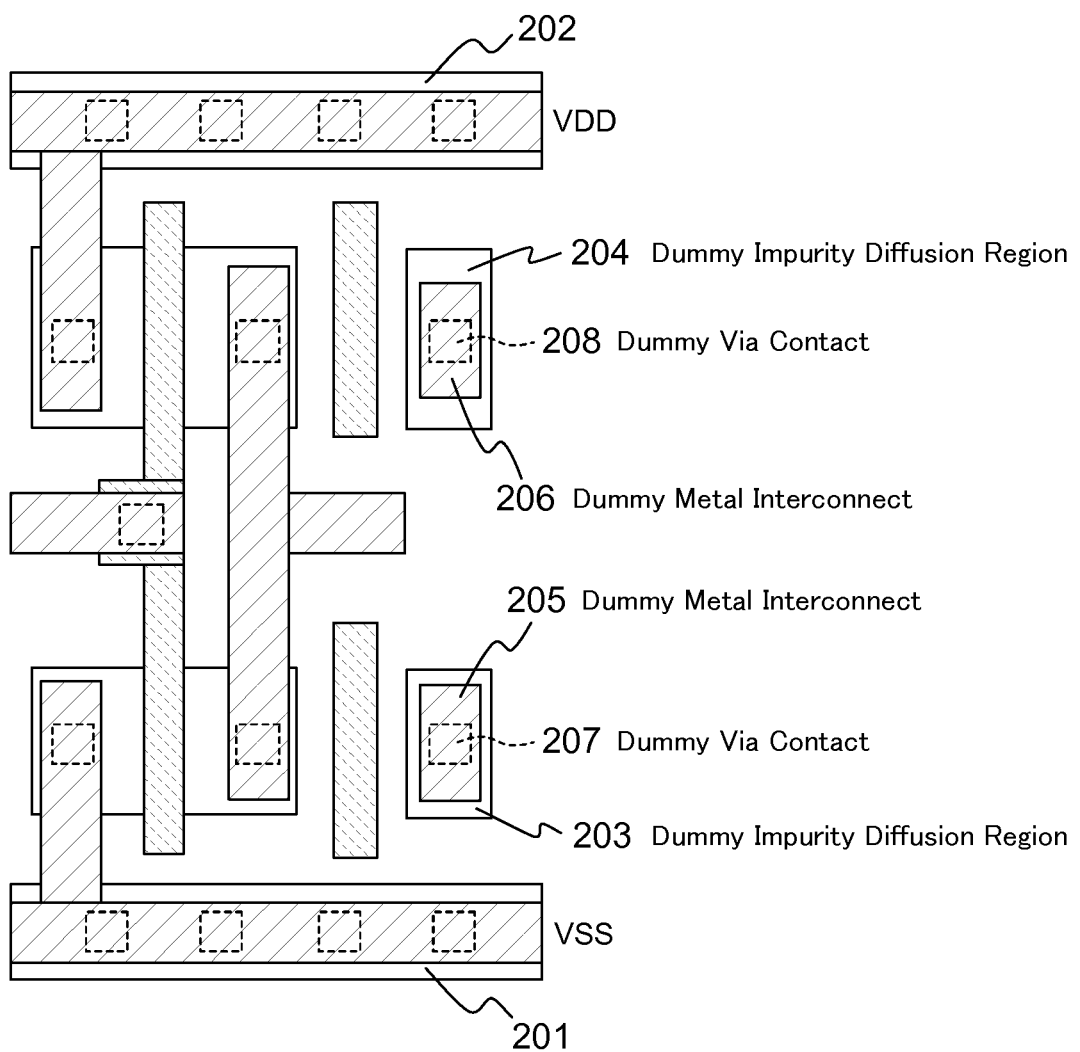
FIG. 10 is a simplified view of a layout structure of a standard cell in a second embodiment of the present invention.

FIG. 10 is a simplified view of a layout structure of a standard cell in a second embodiment of the present invention.

Reference numerals 203, 204 denote dummy impurity diffusion regions. A dummy metal interconnect 205 and a dummy via contact 207 are disposed on the dummy impurity diffusion region 203, and a dummy metal interconnect 206 and a dummy via contact 208 are disposed on the dummy impurity diffusion region 204.

It is general to dispose dummy impurity diffusion regions in a chip in order to eliminate variations in the density of impurity diffusion regions. Disposing the dummy via contacts and the dummy metal interconnects according to the present embodiment on the dummy impurity diffusion regions can also address variations in the density of via contacts.

Third Embodiment

Figure 11:
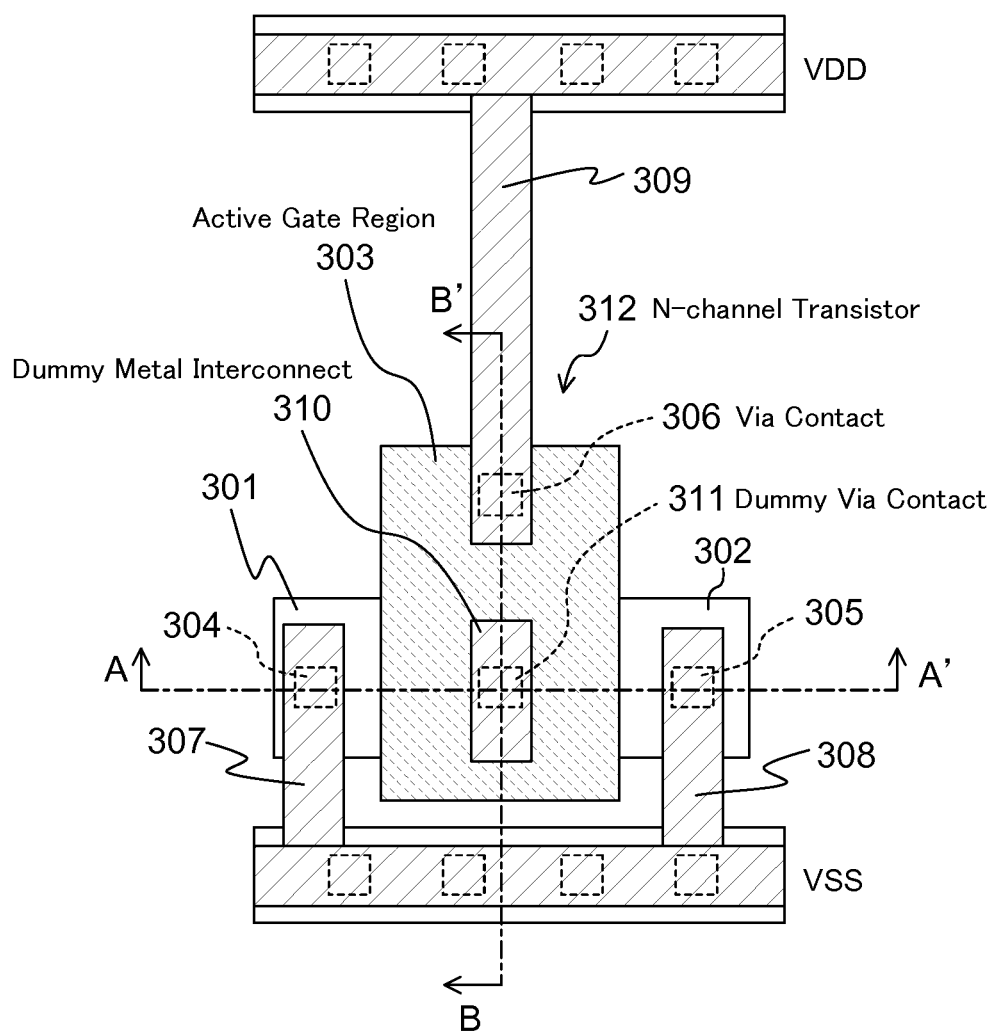
FIG. 11 is a simplified view of a layout structure of a standard cell in a third embodiment of the present invention.
Figure 12:
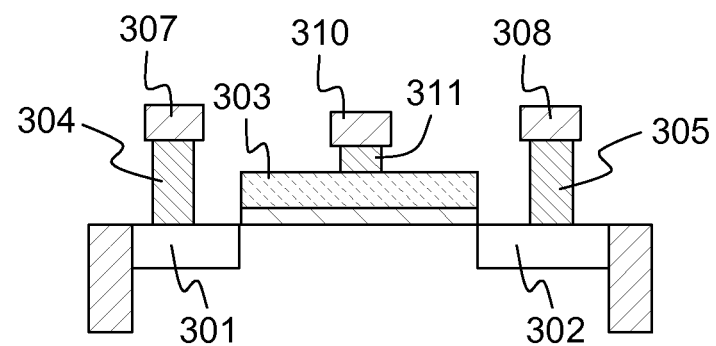
FIG. 12 is a cross-sectional view of the layout structure along the line A-A' of FIG. 11.
Figure 13:
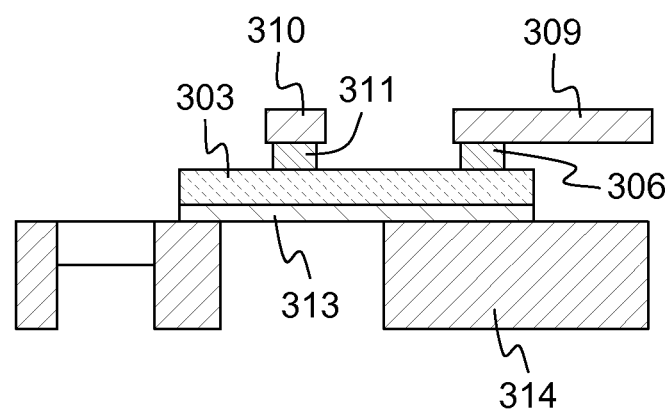
FIG. 13 is a cross-sectional view of the layout structure along the line B-B' of FIG. 11.

FIGS. 11, 12, and 13 are simplified views of a layout structure of a standard cell in a third embodiment of the present invention.

In FIGS. 11-13, reference numerals 301, 302 denote impurity diffusion regions, reference numeral 303 denotes an active gate region, and the impurity diffusion regions 301, 302 and the active gate region 303 form an n-channel transistor 312.

Moreover, reference numerals 304, 305, 306 denote via contacts, reference numerals 307, 308, 309 denote metal interconnects, reference numeral 310 denotes a dummy metal interconnect, and reference numeral 311 denotes a dummy via contact. In FIG. 11, the source potential and the drain potential of the n-channel transistor 312 are fixed at a ground potential VSS, and the gate of the transistor 312 is fixed at a power supply potential VDD. Thus, the transistor 312 is a transistor serving as a capacitor between power supply and ground (hereinafter referred to as a capacitive transistor). Then, on the gate of the capacitive transistor 312, the dummy via contact 311 and the dummy metal interconnect 310 are connected to each other.

Figure 14:
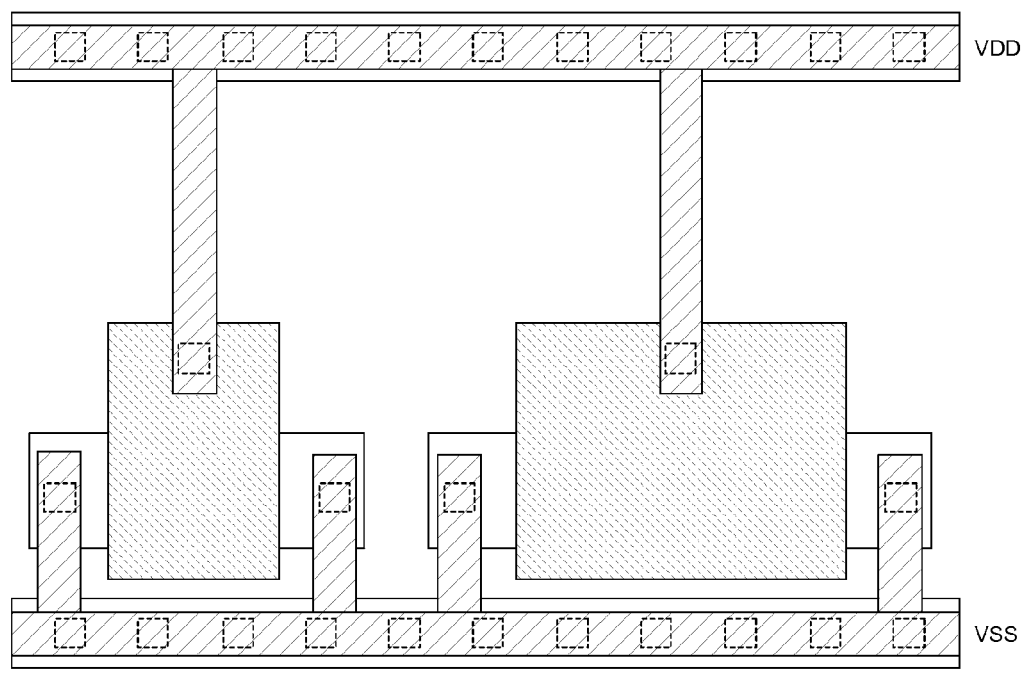
FIG. 14 is a schematic view of a layout structure of a conventional standard cell.

Generally, as the gate length of a capacitive transistor, a gate length larger than a minimum gate length is often used as illustrated in FIG. 11 so that the capacitance is large. When a number of such transistors having large gate lengths is disposed in a concentrated manner, via contacts are sparse as illustrated in FIG. 14, so that variations in the density of the via contacts are large when a chip is viewed as a whole. Then, a region on the gate of the transistor 312 is utilized for disposition of the dummy via contact 311 and the dummy metal interconnect 310 as illustrated in FIG. 11 to reduce the variations in the density of the via contacts.

Note that in the present embodiment, the description has been given taking a capacitive transistor, which is the n-channel transistor 312, as an example, but the present invention is not necessarily limited to the capacitive transistor or to the n-channel transistor.

Moreover, the gate length is not necessarily larger than the minimum gate length, but the present embodiment is applicable as long as a via contact can be placed on the gate.

Fourth Embodiment

Figure 15:
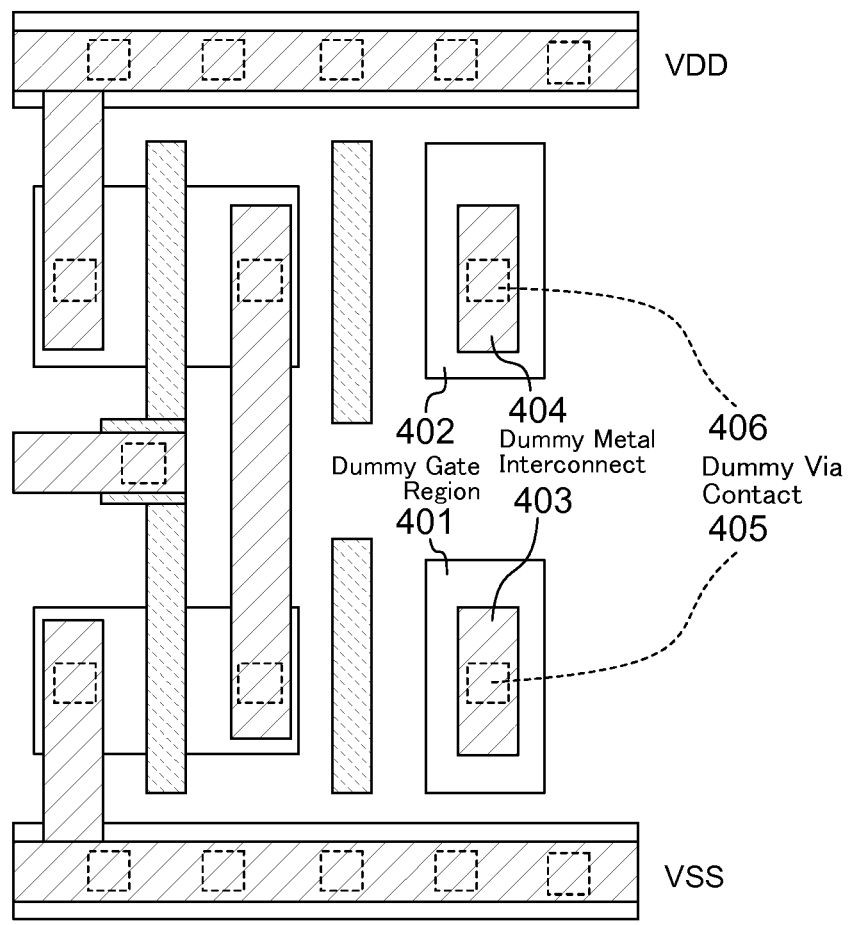
FIG. 15 is a simplified view of a layout structure of a standard cell in a fourth embodiment of the present invention.

FIG. 15 is a simplified view of a layout structure of a standard cell in a fourth embodiment of the present invention.

In the figure, reference numerals 401, 402 denote dummy gate regions, reference numerals 403, 404 denote dummy metal interconnects, and reference numerals 405, 406 denote dummy via contacts.

Figure 16:
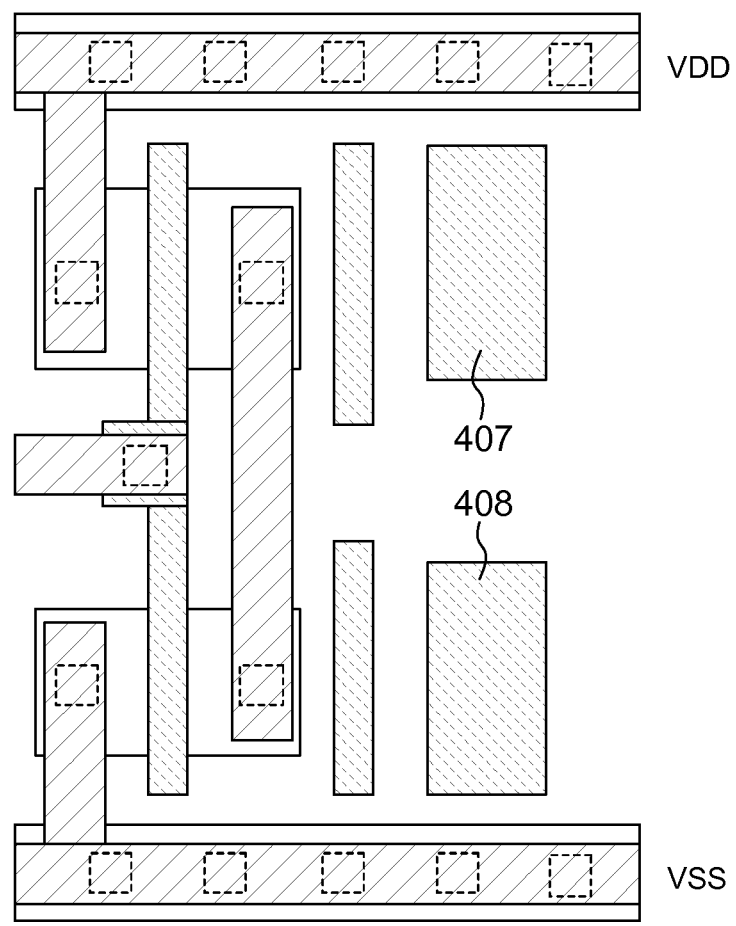
FIG. 16 is a schematic view of a layout structure of a conventional standard cell.

When disposing dummy gate regions in a chip, generally, via contacts are not disposed on dummy gate regions 407, 408 as illustrated in FIG. 16. In the present embodiment, as illustrated in FIG. 15, the dummy gate regions 401, 402 are utilized for disposition of the dummy via contacts 405, 406 and the dummy metal interconnects 403, 404 to reduce variations in the density of the via contacts.

Moreover, for example, also when disposing dummy gate regions to improve the flatness of gate regions, the flatness of the via contacts can also be improved by utilizing the dummy gate regions for disposition of dummy via contacts and dummy metal interconnects according to the present embodiment.

Fifth Embodiment

Figure 17:
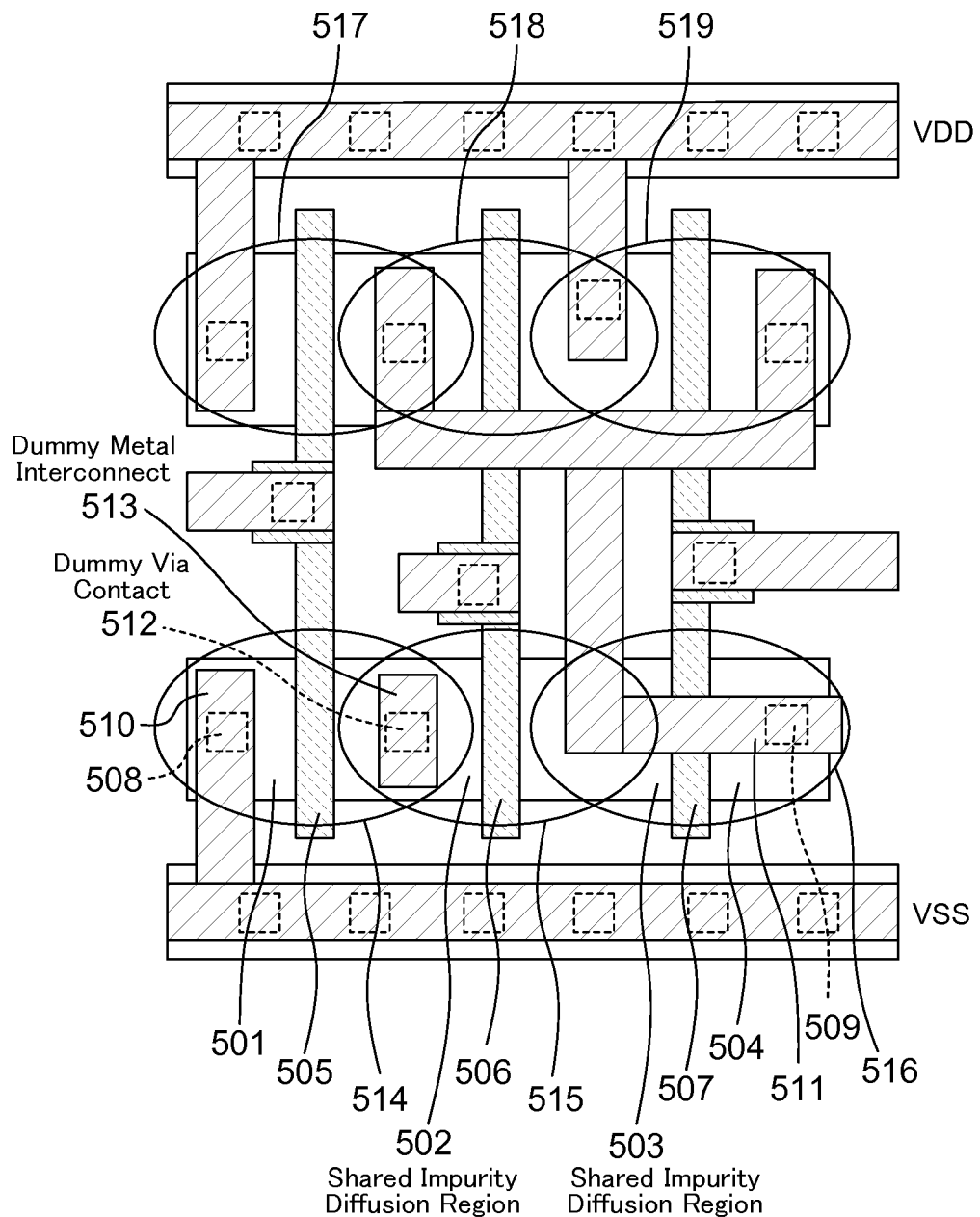
FIG. 17 is a simplified view of a layout structure of a standard cell in a fifth embodiment of the present invention.

FIG. 17 is a simplified view of a layout structure of a standard cell in a fifth embodiment of the present invention.

In the figure, reference numerals 501, 502, 503, 504 denote impurity diffusion regions, reference numerals 505, 506, 507 denote active gate regions, reference numerals 508, 509 denote via contacts, reference numerals 510, 511 denote metal interconnects, reference numeral 512 denotes a dummy via contact, and reference numeral 513 denotes a dummy metal interconnect.

The impurity diffusion regions 501, 502 and the active gate region 505 form an n-channel transistor 514. Likewise, the impurity diffusion regions 502, 503 and the active gate region 506 form an n-channel transistor 515, and the impurity diffusion regions 503, 504 and the active gate region 507 form an n-channel transistor 516.

The n-channel transistor 514 and the n-channel transistor 515 share the impurity diffusion region 502, and the n-channel transistor 515 and the n-channel transistor 516 share the impurity diffusion region 503. In this way, the three n-channel transistors 514, 515, 516 are connected to each other in series.

In the same manner as the three n-channel transistors 514-516, three p-channel transistors 517, 518, 519 are formed in the upper portion of the figure. These six transistors 514-519 form a three-input NAND circuit.

Then, in the three n-channel transistors 514-516 connected to each other in series, the dummy via contact 512 and the dummy metal interconnect 513 are disposed only on the impurity diffusion region 502 of the two shared impurity diffusion regions 502, 503.

Figure 18:
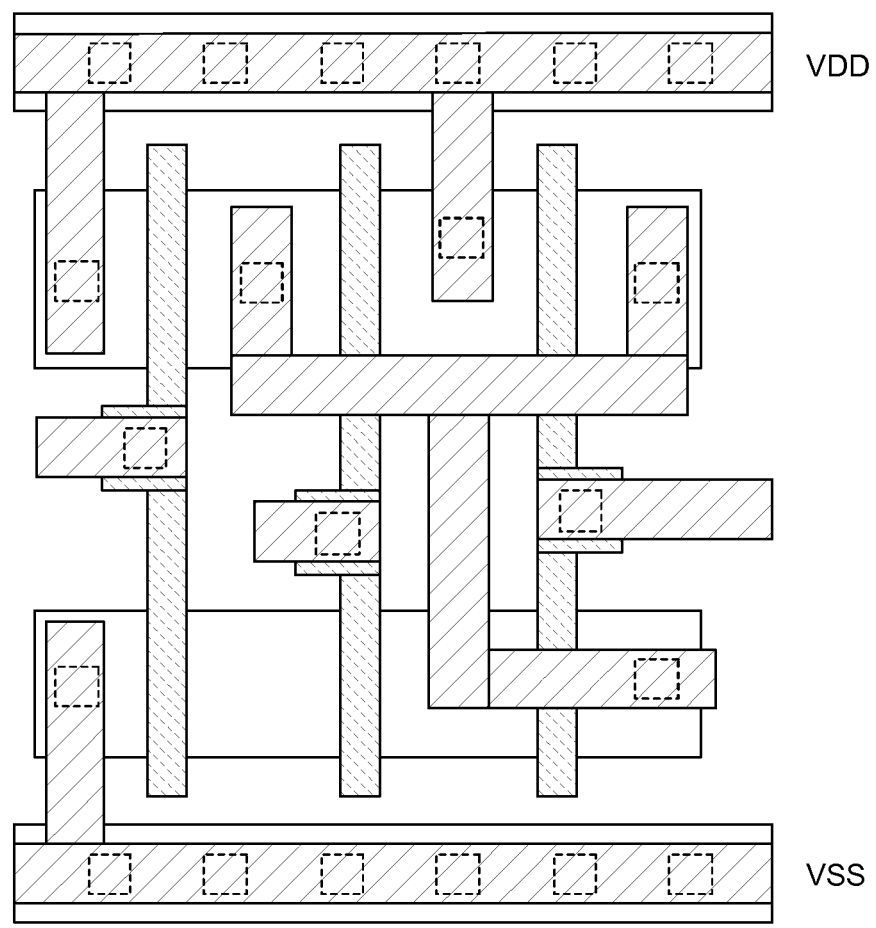
FIG. 18 is a schematic view of a layout structure of a conventional standard cell.

Basically, via contacts are not disposed on the impurity diffusion regions 502, 503 shared in the three-input NAND circuit as illustrated in FIG. 18. Then, these vacant regions are utilized for disposition of the dummy via contact 512 and the dummy metal interconnect 513 to reduce variations in the density of the via contacts.

However, disposing dummy via contacts and dummy metal interconnects on all shared impurity diffusion regions, e.g., on both of the shared impurity diffusion regions 502, 503 in FIG. 17, drastically limits regions which can be used for interconnects, which may increase the area of the standard cell. Therefore, one or more of the shared impurity diffusion regions are not provided with the dummy via contacts and the dummy metal interconnects, and are left as regions which can freely be used for interconnects.

As described above, at least one or more impurity diffusion regions on which dummy via contacts and dummy metal interconnects are disposed, and at least one or more shared impurity diffusion regions on which dummy via contacts and dummy metal interconnects are not disposed are provided, so that the difference in the density of the via contacts can effectively be reduced while ensuring the flexibility in interconnection in a layout.

Figure 19:
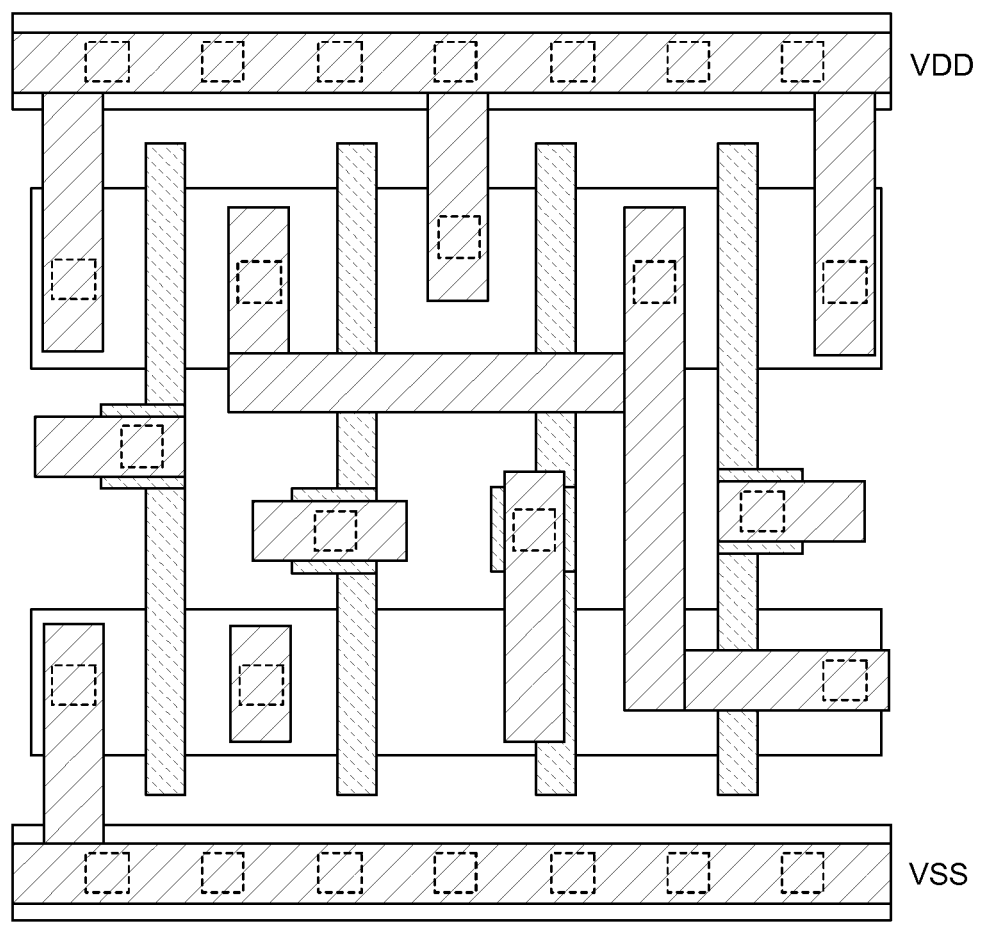
FIG. 19 is a simplified view illustrating a variation of the layout structure of the standard cell in the fifth embodiment of the present invention.
Figure 20:
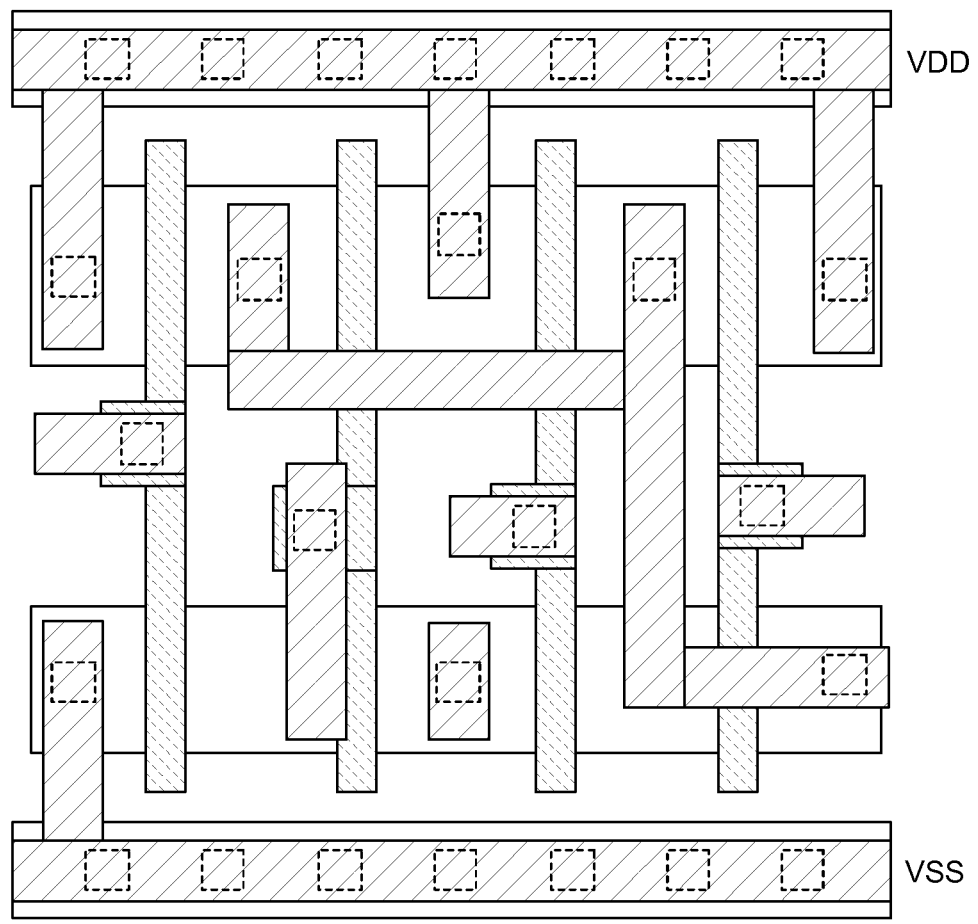
FIG. 20 is a simplified view illustrating a variation of the layout structure of the standard cell in the fifth embodiment of the present invention.
Figure 21:
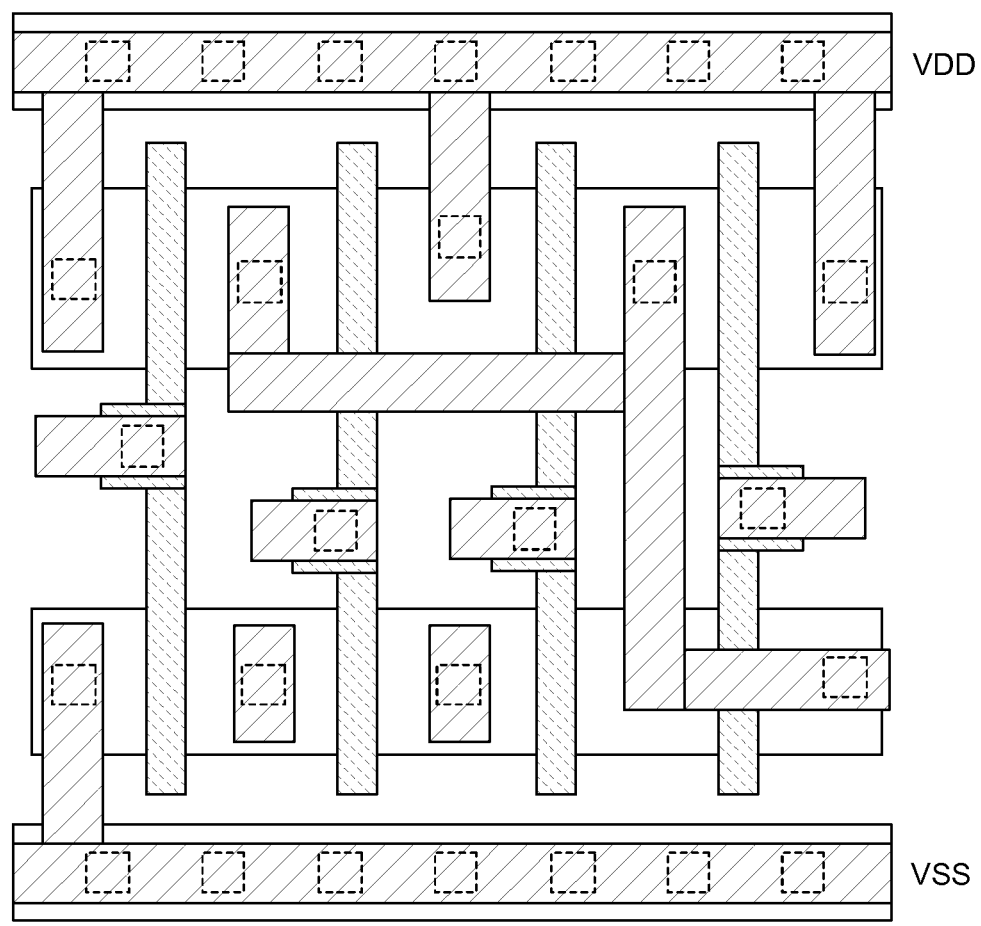
FIG. 21 is a simplified view illustrating a variation of the layout structure of the standard cell in the fifth embodiment of the present invention.

Note that in the present embodiment, the description has been given taking the three-input NAND circuit as an example, but the present embodiment is not limited to the three-input NAND circuit. For example, in the case of a NAND circuit having four or more inputs, patterns as illustrated in FIGS. 19, 20, 21 are possible. In the case of a NAND circuit having four or more inputs, the NAND circuit includes three or more shared impurity diffusion regions. Thus, it is possible to provide at least one or more shared impurity diffusion regions on which dummy via contacts and dummy metal interconnects are disposed, and at least one or more shared impurity diffusion regions on which dummy via contacts and dummy metal interconnects are not disposed.

Figure 22:
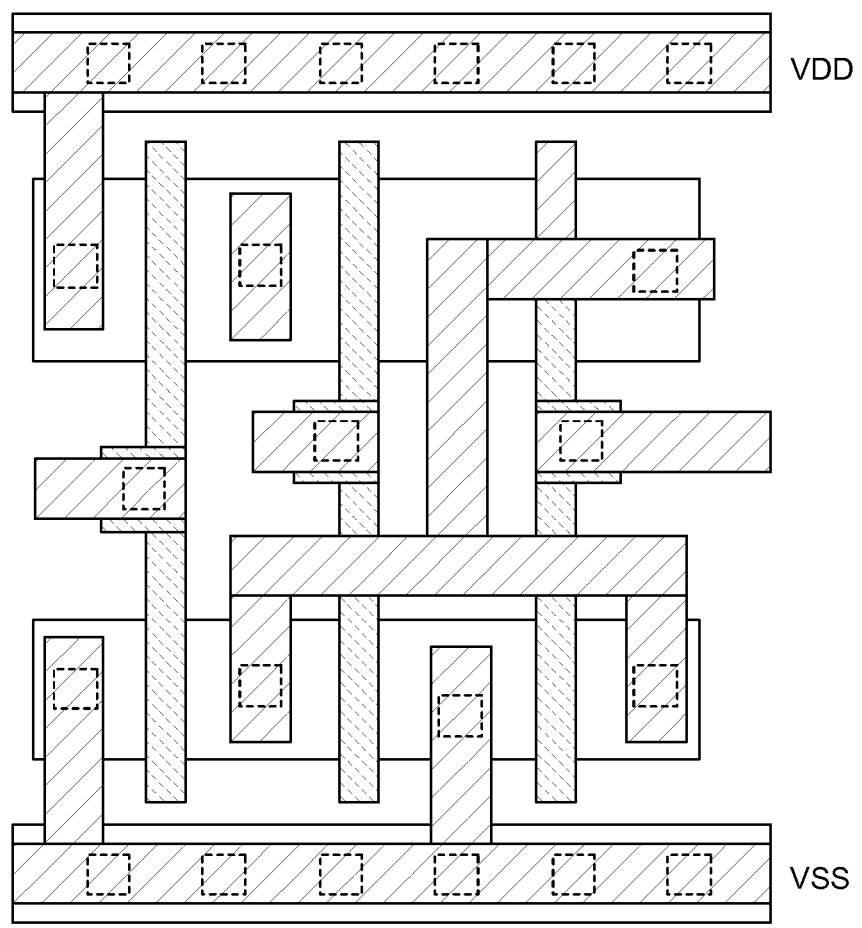
FIG. 22 is a simplified view illustrating a variation of the layout structure of the standard cell in the fifth embodiment of the present invention.
Figure 23:
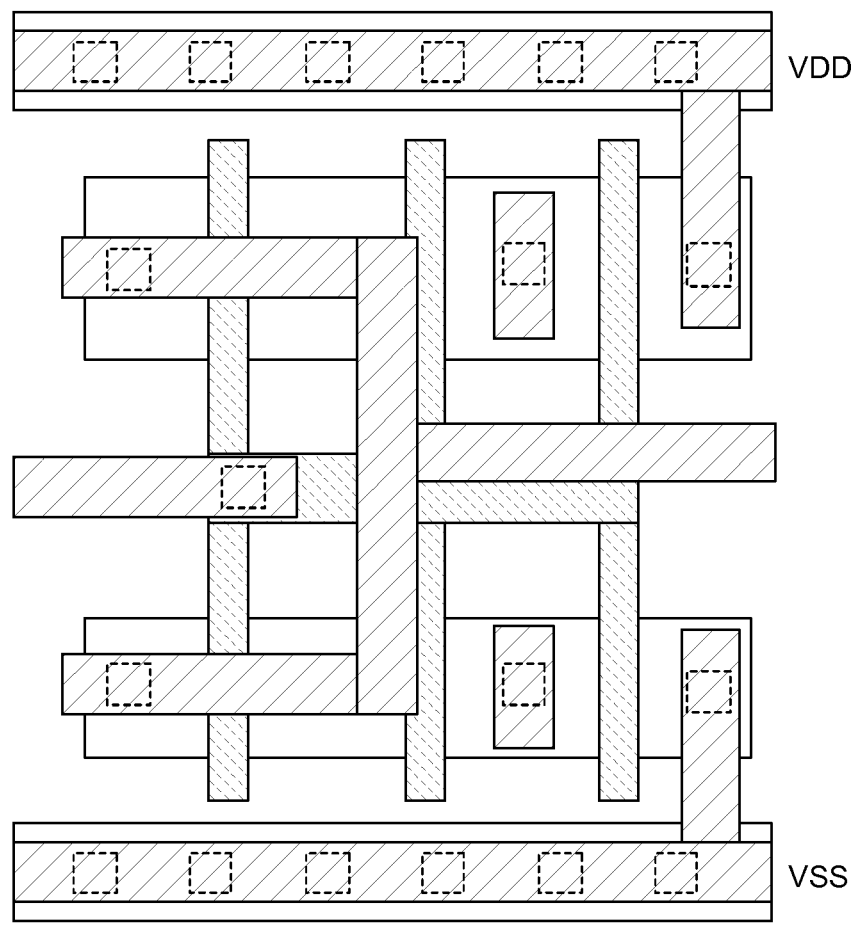
FIG. 23 is a simplified view illustrating another variation of the layout structure of the fifth embodiment.
Figure 24:
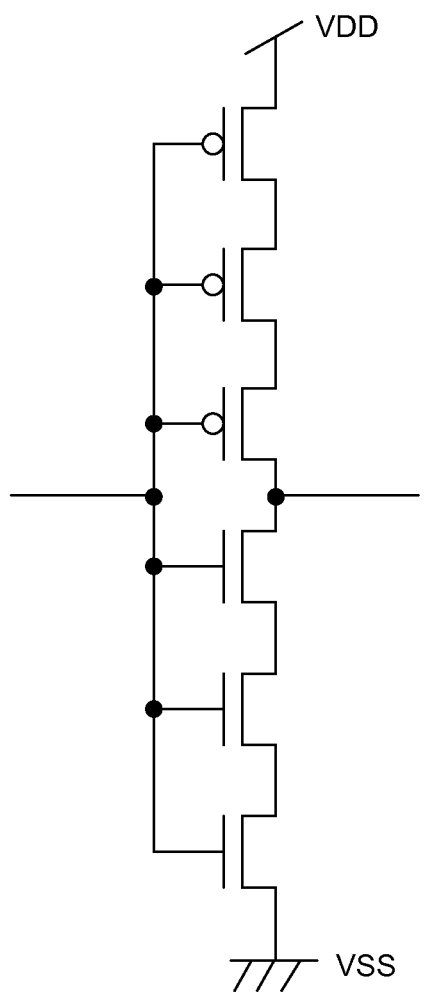
FIG. 24 is a circuit diagram of the layout structure of FIG. 23.

FIGS. 22, 23, 24 illustrate variations of the present embodiment. FIG. 22 illustrates a three-input NOR circuit. FIG. 23 illustrates an inverter circuit whose circuit diagram is illustrated in FIG. 24. As illustrated here, the present embodiment is not limited to a NAND circuit structure, but is applicable to any circuit including a portion in which three or more transistors are connected to each other in series.

Figure 25:
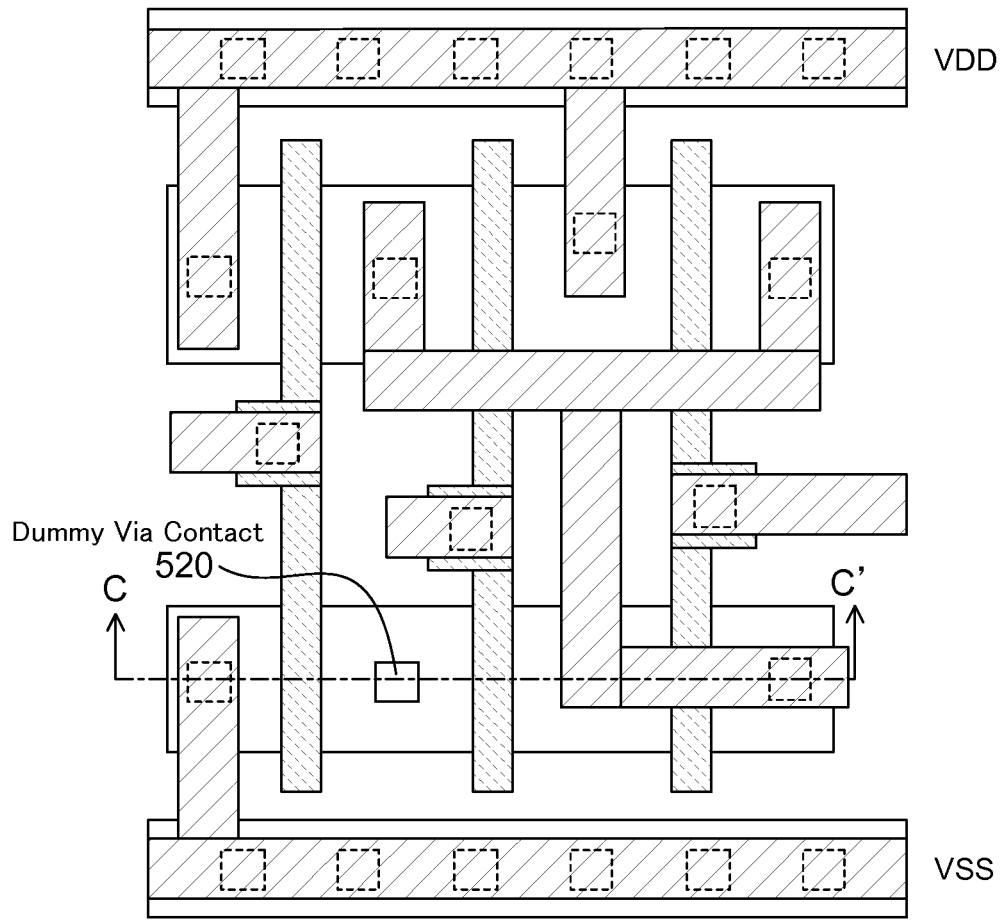
FIG. 25 is a simplified view illustrating another variation of the layout structure of the standard cell in the fifth embodiment of the present invention.
Figure 26:
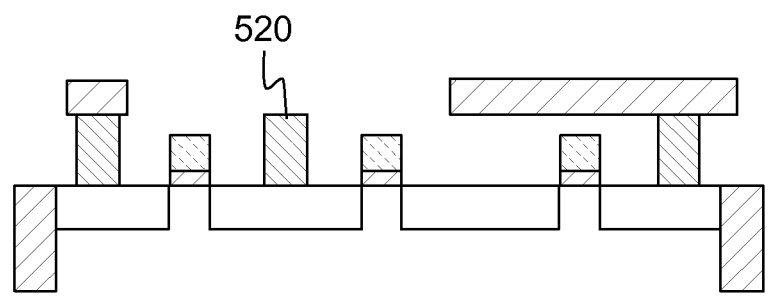
FIG. 26 is a cross-sectional view of the layout structure along the line C-C' of FIG. 25.

FIGS. 25, 26 are simplified views of a layout structure of a standard cell in a variation of the fifth embodiment. This layout structure is different from that of FIG. 17 in that the dummy metal interconnect is not disposed on the dummy via contact, and only a dummy via contact 520 is disposed.

When a dummy via contact and a dummy metal interconnect are disposed in sets, the space between the dummy metal interconnect and a metal interconnect in the periphery of the dummy metal interconnect has to be ensured. This may require narrowing the width of the peripheral metal interconnect, narrowing spaces between the interconnects, or the like, so that a layout improving the manufacturing yield may not necessarily be obtained. Therefore, if it is not possible to ensure a sufficient space for disposing metal interconnects, only the dummy via contact is disposed, and the dummy metal interconnect is not disposed on the dummy via contact. Since the dummy metal interconnect itself is a metal interconnect unnecessary for logic operation of a circuit, omitting the dummy metal interconnect provides no problems. When the dummy metal interconnect is not disposed, the space between metal interconnects in the periphery of the dummy metal interconnect increases, so that it is possible to reduce manufacturing defects such as a short circuit between the metal interconnects, and insufficient coverage of via contacts with the metal interconnects. Moreover, since the dummy metal interconnect is not disposed on the dummy via contact, a space may be ensured in consideration of the relationship between different layers, such as an alignment margin between the dummy via contact and the metal interconnect so that no short circuit is caused between the dummy via contact and the peripheral metal interconnect. The space which causes no short circuit is smaller than the space between the dummy metal interconnect and the peripheral metal interconnect. Thus, the layout may be downsized by the difference between (i) the space which causes no short circuit and (ii) the space between the dummy metal interconnect and the peripheral metal interconnect. Moreover, when the dummy metal interconnect is not disposed on the dummy via contact, the capacitance between the dummy metal interconnect and the peripheral metal interconnect can be reduced. This improves delay characteristics when the delay time is to be reduced.

As described above, only a dummy via contact is disposed in a portion in which disposing a dummy metal interconnect is difficult, thereby reducing variations in the density of via contacts and improving their flatness, so that it is possible to improve the manufacturing yield of metal interconnects while improving the manufacturing yield, and it is further possible to reduce the area of the standard cell and to change the delay characteristics of the standard cell.

Note that in the variation of the present embodiment, a form without a dummy metal interconnect on a dummy via contact has been compared with the fifth embodiment taken as an example, but the form is not limited to the dummy via contact on the series transistor described in the fifth embodiment, and is applicable to the dummy via contacts described in the first to fourth embodiments. A dummy via contact and a dummy metal interconnect are not necessarily in sets in all layout forms.

Sixth Embodiment

Figure 27:
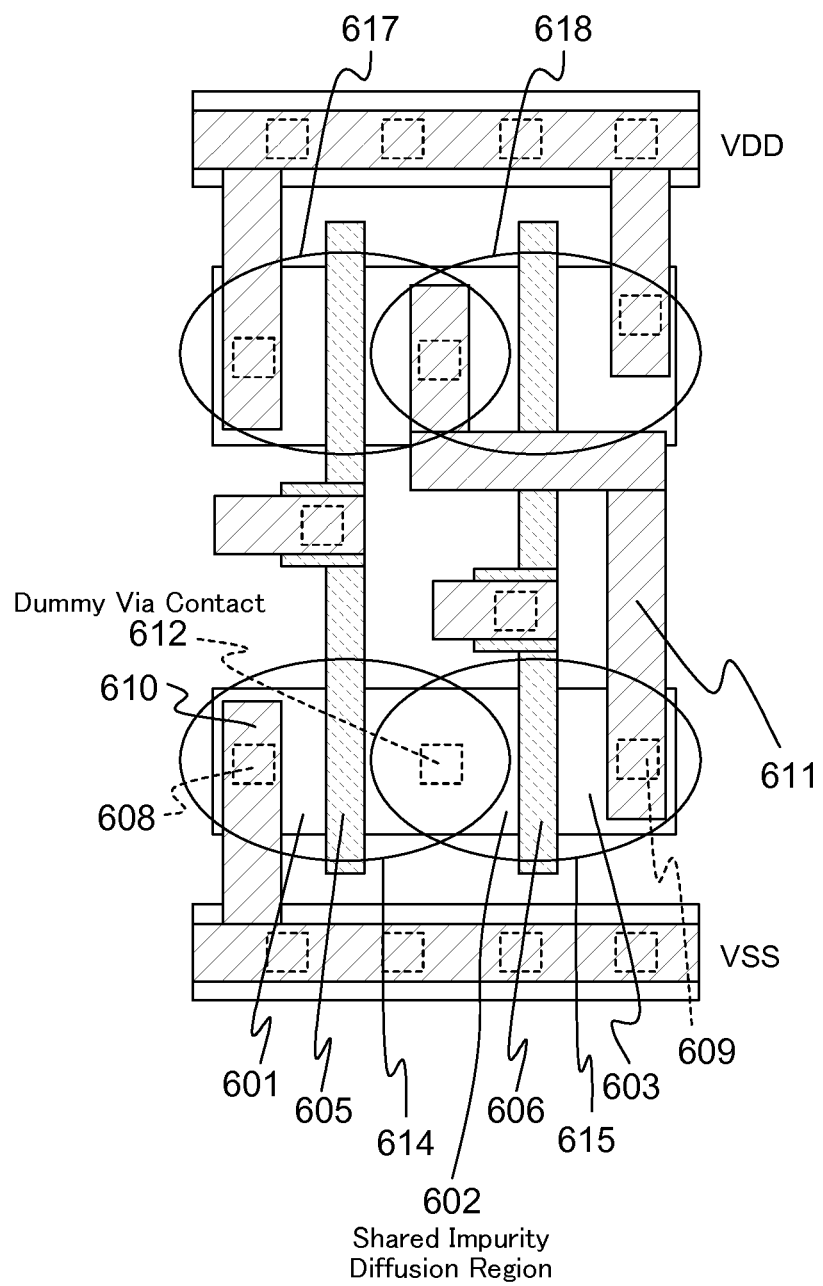
FIG. 27 is a simplified view of a layout structure of a standard cell in a sixth embodiment of the present invention.

FIG. 27 is a simplified view of a layout structure of a standard cell in a sixth embodiment of the present invention.

In the figure, reference numerals 601, 602, 603 denote impurity diffusion regions, reference numerals 605, 606 denote active gate regions, reference numerals 608, 609 denote via contacts, reference numerals 610, 611 denote metal interconnects, and reference numeral 612 denotes a dummy via contact.

The impurity diffusion regions 601, 602 and the active gate region 605 form an n-channel transistor 614. Likewise, the impurity diffusion regions 602, 603 and the active gate region 606 form an n-channel transistor 615.

The n-channel transistor 614 and the n-channel transistor 615 share the impurity diffusion region 602, and in this way, the two n-channel transistors 614, 615 are connected to each other in series.

In the same manner as the two n-channel transistors 614, 615, two p-channel transistors 617, 618 are formed in an upper portion of the figure. These four transistors 614, 615, 617, and 618 form a two-input NAND circuit.

Then, in the two n-channel transistors 614, 615 connected to each other in series, the dummy via contact 612 is disposed on the shared impurity diffusion region 602.

Figure 28:
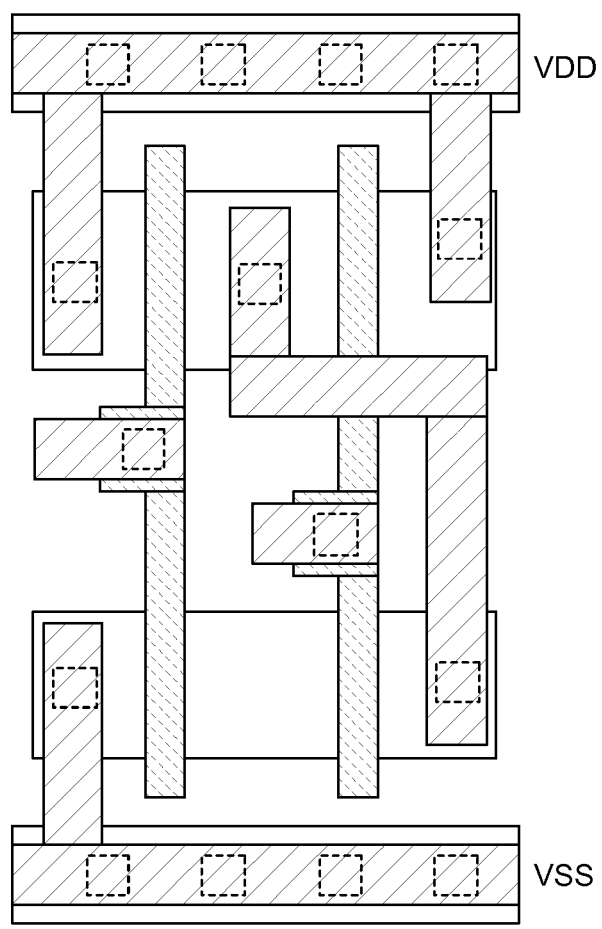
FIG. 28 is a schematic view of a layout structure of a conventional standard cell.

Basically, on the impurity diffusion region 602 shared in the two-input NAND circuit, a via contact is not disposed as illustrated in FIG. 28. Then, this vacant region is utilized for disposition of the dummy via contact 612 to reduce variations in the density of the via contacts.

Here, a dummy metal interconnect is not disposed on the dummy via contact 612. This reduces the capacitance between the dummy metal interconnect and metal interconnects in the periphery of the dummy via contact. Moreover, it is no longer necessary to ensure interconnection space between the dummy metal interconnect and the interconnects in the periphery of the dummy via contact 612. Thus, the flexibility in interconnection increases. Furthermore, the relationship between different layers such as an alignment margin to the dummy via contact 612 may only be taken into consideration. Thus, the space between the dummy via contact and the peripheral metal interconnects can be designed to be smaller than that in a layout including a dummy metal interconnect. Therefore, it is possible to obtain the advantage of reducing the area.

As described above, providing a shared impurity diffusion region having only a dummy via contact can effectively reduce the difference in the density of the via contacts while ensuring the flexibility in interconnection in a layout, and it is also possible to obtain the advantage of reducing the area.

Figure 29:
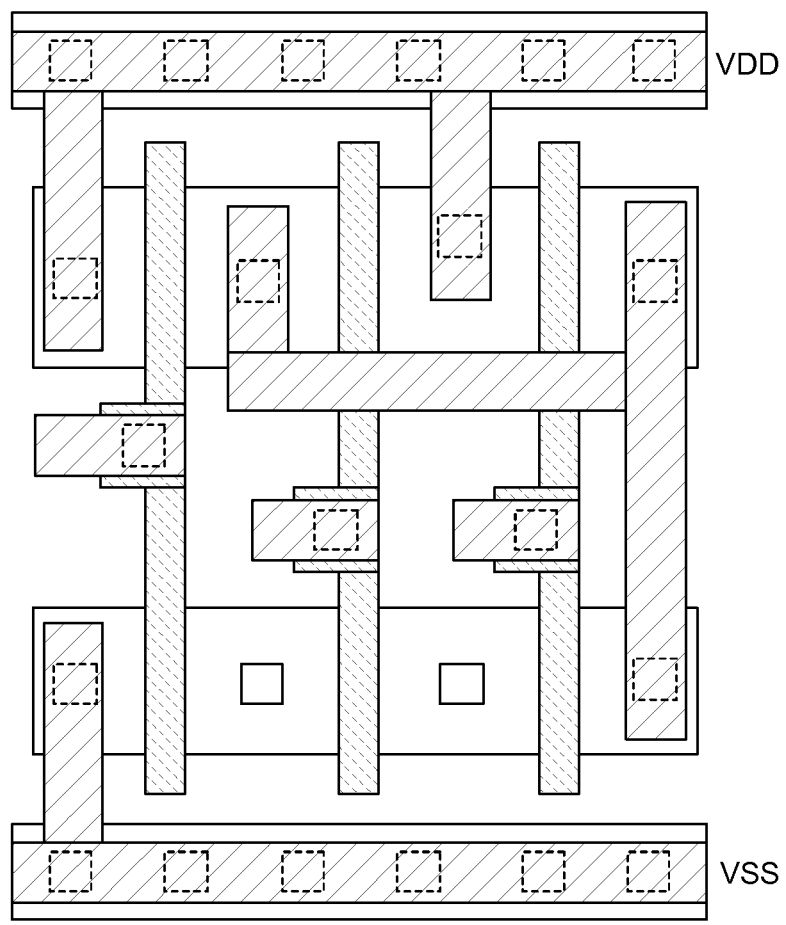
FIG. 29 is a simplified view illustrating a variation of the layout structure of the standard cell in the sixth embodiment of the present invention.

Note that in the present embodiment, the description has been given taking the two-input NAND circuit as an example, but the present embodiment is not limited to the two-input NAND circuit. For example, in the case of a three-input NAND circuit, a pattern as illustrated in FIG. 29 is possible. In the case of a NAND circuit having three or more inputs, the NAND circuit includes two or more shared impurity diffusion regions. Thus, it is possible to provide at least one or more shared impurity diffusion regions in which dummy via contacts are disposed.

Figure 30:
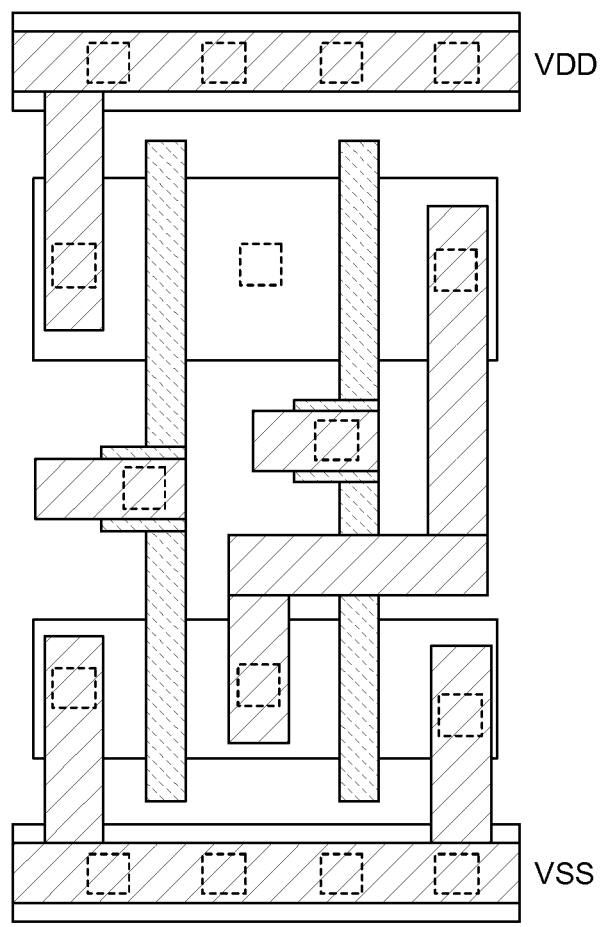
FIG. 30 is a simplified view illustrating a variation of the layout structure of the standard cell in the sixth embodiment of the present invention.
Figure 31:
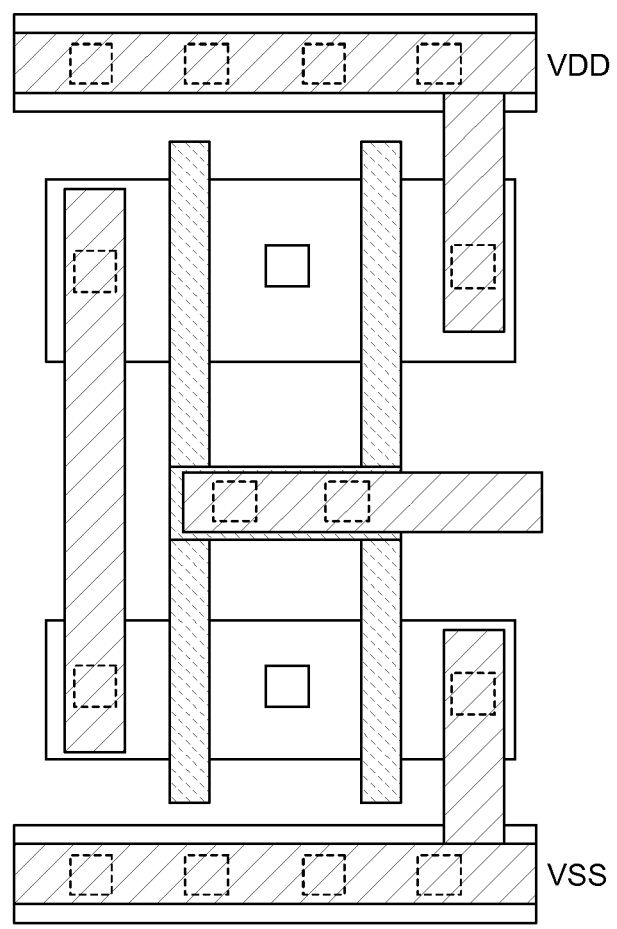
FIG. 31 is a simplified view illustrating another variation of the layout structure of the sixth embodiment.

FIGS. 30 and 31 illustrate variations of the present embodiment. FIG. 30 illustrates a two-input NOR circuit. FIG. 31 illustrates an inverter circuit. As illustrated here, the present embodiment is not limited to a NAND circuit structure, but is applicable to any circuit including a portion in which two or more transistors are connected to each other in series.

Seventh Embodiment

Figure 32:
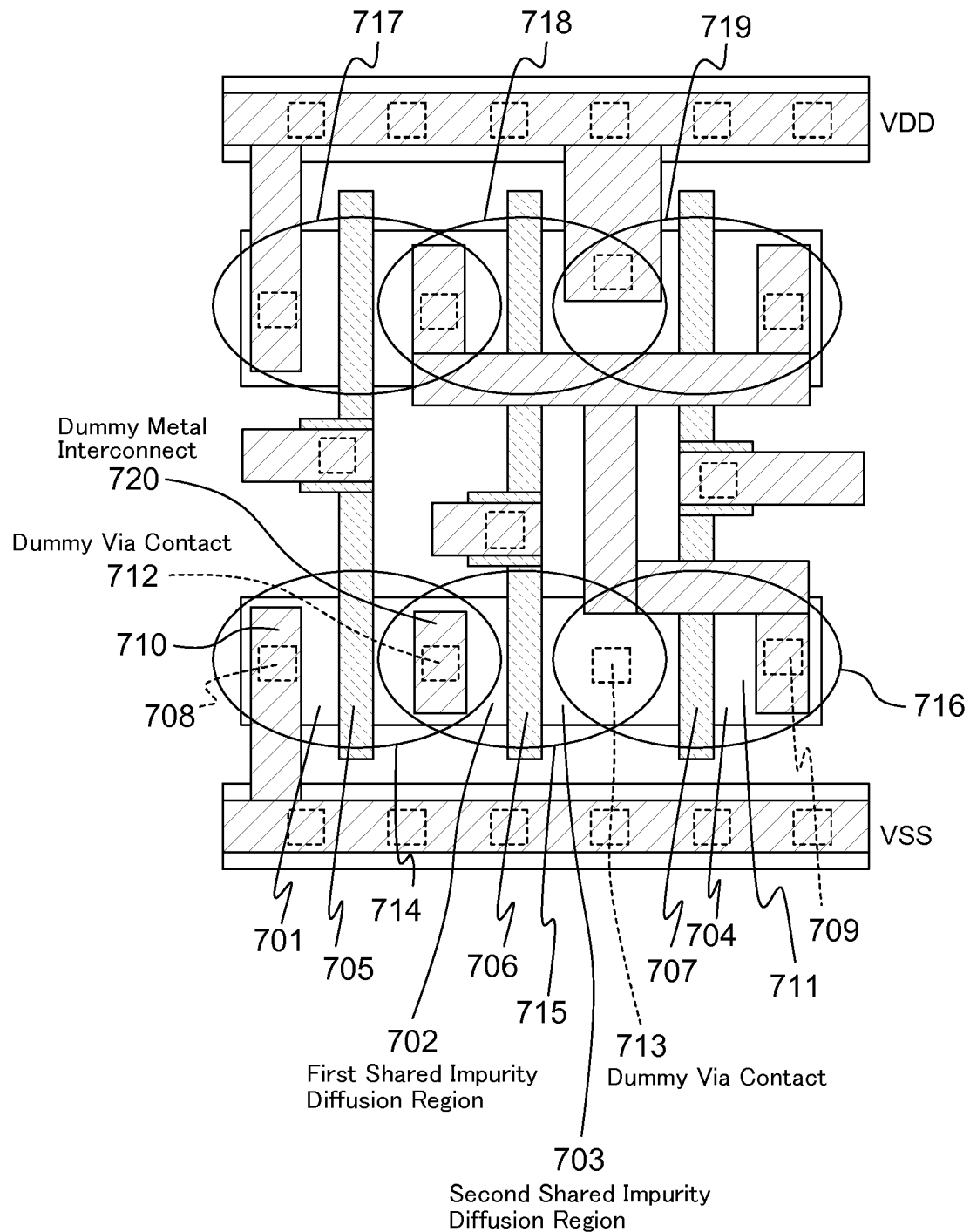
FIG. 32 is a simplified view of a layout structure of a standard cell in a seventh embodiment of the present invention.

FIG. 32 is a simplified view of a layout structure of a standard cell in a seventh embodiment of the present invention.

In the figure, reference numerals 701, 702, 703, 704 denote impurity diffusion regions, reference numerals 705, 706, 707 denote active gate regions, reference numerals 708, 709 denote via contacts, reference numerals 710, 711 denote metal interconnects, reference numerals 712, 713 denote dummy via contacts, and reference numeral 720 denotes a dummy metal interconnect.

The impurity diffusion regions 701, 702 and the active gate region 705 form an n-channel transistor 714. Likewise, the impurity diffusion regions 702, 703 and the active gate region 706 form an n-channel transistor 715, and the impurity diffusion regions 703, 704 and the active gate region 707 form an n-channel transistor 716.

The n-channel transistor 714 and the n-channel transistor 715 share the first impurity diffusion region 702, and the n-channel transistor 715 and the n-channel transistor 716 share the second impurity diffusion region 703. In this way, the three n-channel transistors 714, 715, 716 are connected to each other in series.

In the same manner as the three n-channel transistors 714, 715, 716, three p-channel transistors 717, 718, 719 are formed in an upper portion of the figure. These six transistors 714-719 form a three-input NAND circuit.

Then, in the three n-channel transistors 714, 715, 716 connected to each other in series, the dummy via contacts 712, 713 are disposed on the shared first impurity diffusion region 702 and the shared second impurity diffusion region 703, respectively, and the dummy metal interconnect 720 is disposed on the dummy via contact 712.

Basically, via contacts are not disposed on the impurity diffusion regions 702, 703 shared in the three-input NAND circuit as illustrated in FIG. 18. Then, these vacant regions are utilized for disposition of the dummy via contacts 712, 713 and the dummy metal interconnect 720 to reduce variations in the density of the via contacts.

The present embodiment is different from the fifth embodiment in the following point. The fifth embodiment describes a method in which a shared impurity diffusion region without a dummy via contact is provided to improve the flexibility in interconnection, and thus priority is given to the flexibility in interconnection. In contrast, the present embodiment describes a method in which dummy via contacts are disposed on all shared impurity diffusion regions on which via contacts required for logic operation are not disposed, and the presence or absence of dummy metal interconnects ensures the flexibility in interconnection, and thus priority is given to flattening dummy via contacts.

As described above, shared impurity diffusion regions on which dummy via contacts are disposed, and at least one of the shared impurity diffusion regions on which at least one or more dummy metal interconnects are not disposed are provided, so that the difference in the density of via contacts can effectively be reduced while ensuring the flexibility in interconnection in a layout.

Figure 33:
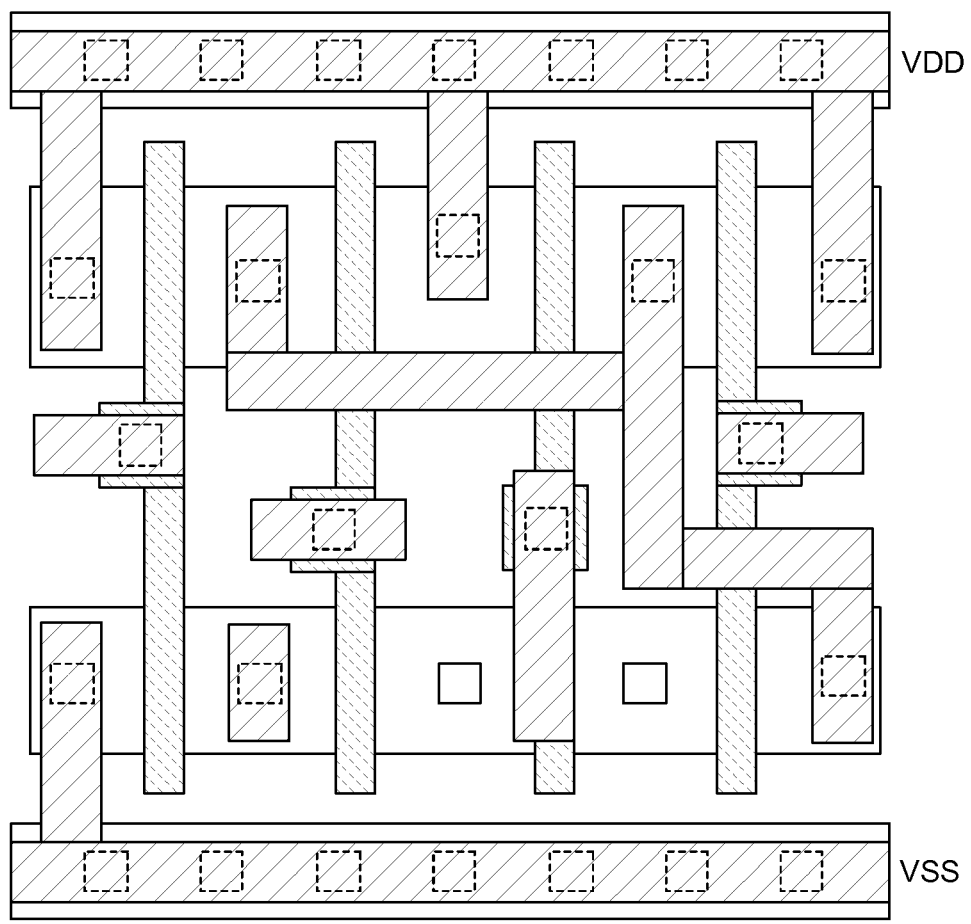
FIG. 33 is a simplified view illustrating a variation of the layout structure of the standard cell in the seventh embodiment of the present invention.
Figure 34:
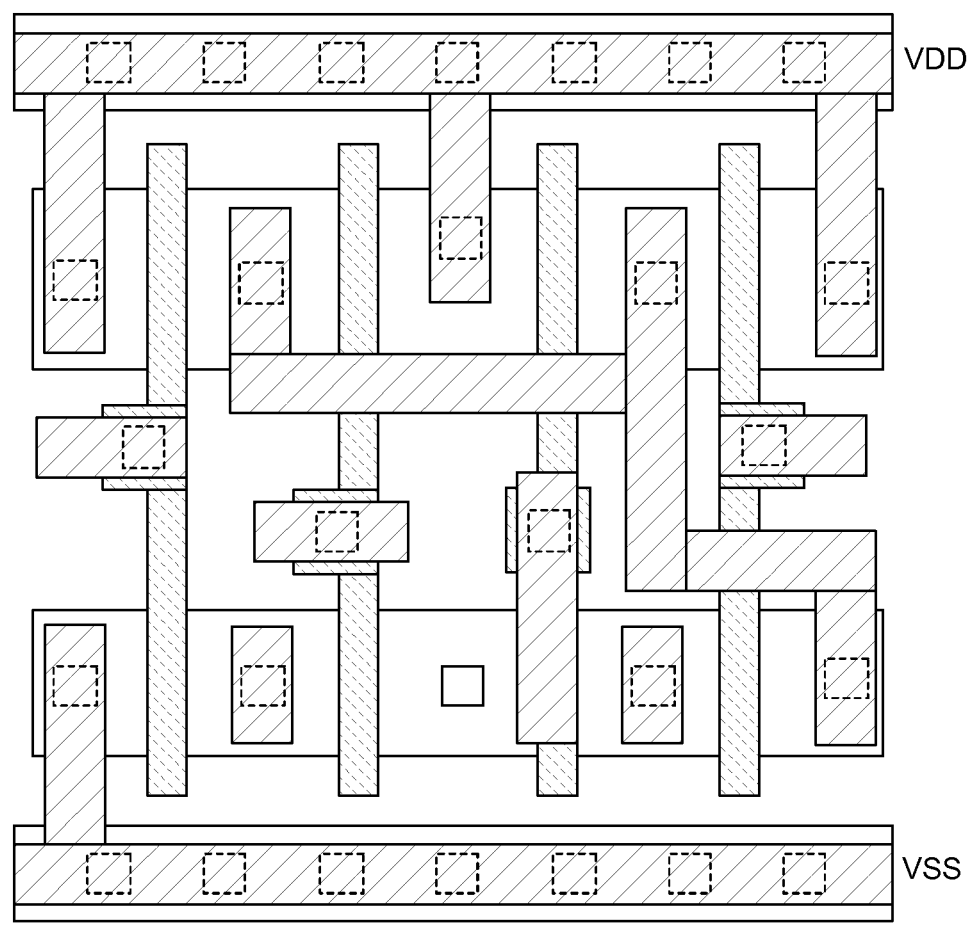
FIG. 34 is a simplified view illustrating a variation of the layout structure of the standard cell in the seventh embodiment of the present invention.

Note that in the present embodiment, the descriptions has been given taking the three-input NAND circuit as an example, but the present embodiment is not limited to the three-input NAND circuit. For example, in the case of a four-input NAND circuit, patterns as illustrated in FIGS. 33, 34 are possible. In the case of a NAND circuit including four or more inputs, the NAND circuit includes three or more shared impurity diffusion regions. Thus, it is possible to provide shared impurity diffusion regions in which dummy via contacts are disposed, and at least one of the shared impurity diffusion regions in which at least one or more dummy metal interconnects are not disposed.

Figure 35:
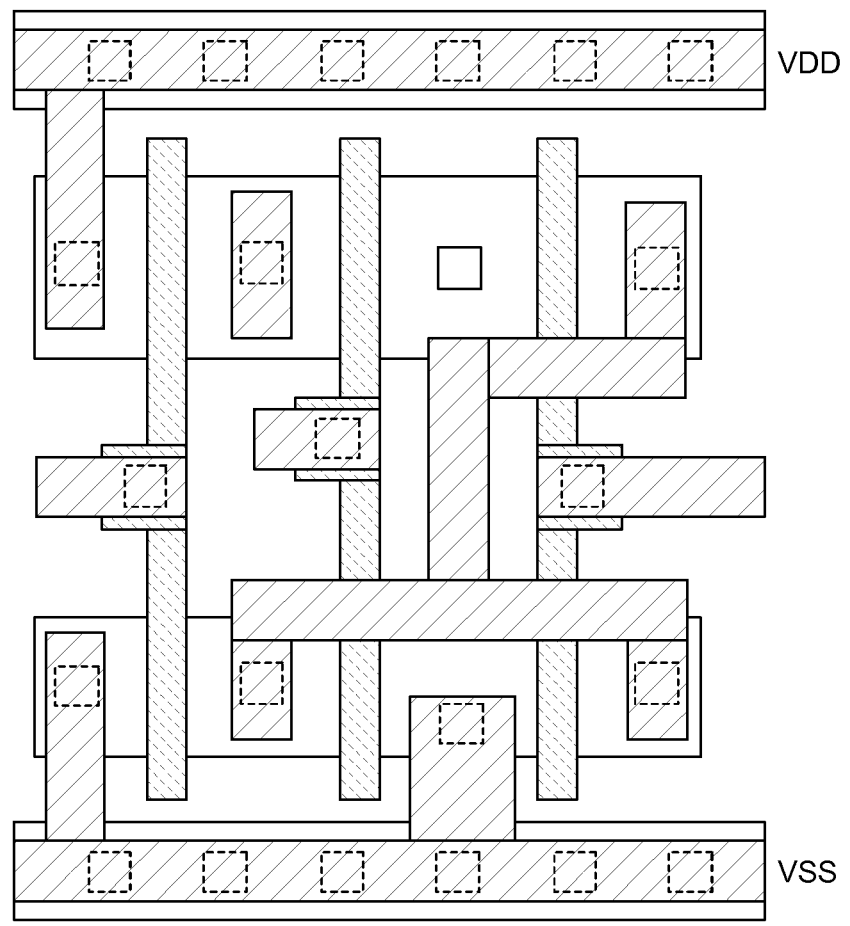
FIG. 35 is a simplified view illustrating a variation of the layout structure of the standard cell in the seventh embodiment of the present invention.
Figure 36:
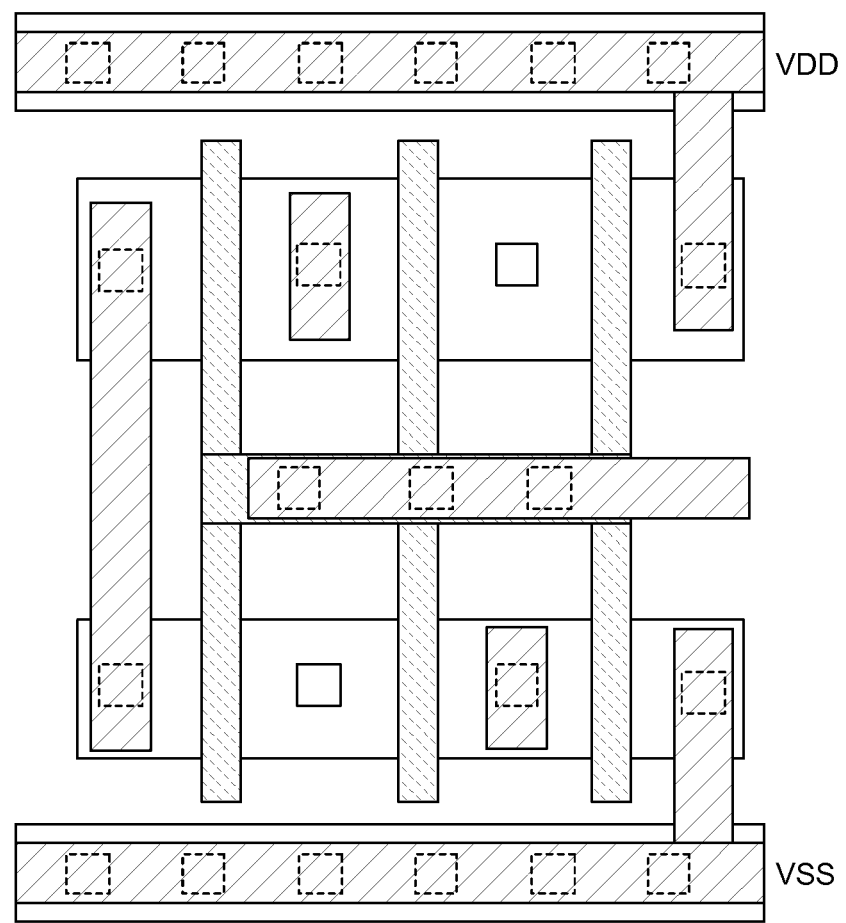
FIG. 36 is a simplified view illustrating another variation of the layout structure of the seventh embodiment.
Figure 37:
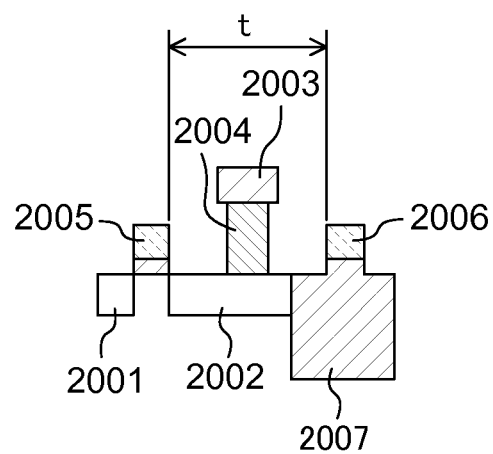
FIG. 37 is a view illustrating a configuration of main components of a layout structure of a conventional standard cell.

FIGS. 35 and 36 illustrate variations of the present embodiment. FIG. 35 illustrates a three-input NOR circuit. FIG. 36 illustrates an inverter circuit. As illustrated here, the present embodiment is not limited to a NAND circuit structure, but is applicable to any circuit including a portion in which three or more transistors are connected to each other in series.

The layout structures of the standard cells described in the first to seventh embodiments are previously stored as a standard cell library. A standard cell in the standard cell library is mounted and used together with a standard cell stored in a library other than the standard cell library to form a semiconductor integrated circuit (LSI).

Industrial Applicability

As described above, with the present invention, it is possible to dispose dummy via contacts in consideration of layout efficiency, so that the difference in the density of via contacts can be reduced without increasing the layout area, manufacturing defects of the via contacts can be reduced, and the manufacturing yield of LSIs can be improved, and thus the present invention is useful for standard cells, standard cell libraries, layout structures of semiconductor integrated circuits, semiconductor integrated circuits mounted on various electronic devices, and the like.

What is claimed is:

1. A layout structure of a standard cell, comprising:
    a first metal interconnect for providing a first power potential, the first metal interconnect extending in a first direction;
    a second metal interconnect for providing a second power potential, the second metal interconnect extending in the first direction;
    a logic circuit disposed between the first metal interconnect and the second metal interconnect, and including a metal interconnect and a transistor, for accomplishing a logic operation, the transistor including a gate electrode extending in a second direction orthogonal to the first direction;
    a dummy impurity diffusion region which does not accomplish any logic operation;
    a dummy via contact which is provided on the dummy impurity diffusion region, is not connected to the logic circuit and does not accomplish any logic operation; and
    a dummy gate electrode which does not accomplish any logic operation and extends in the second direction.

2. The layout structure of a standard cell of claim 1, further comprising:
    a dummy metal interconnect which does not accomplish any logic operation,
    wherein the dummy via contact is connected to the dummy metal interconnect.

3. The layout structure of a standard cell of claim 2, wherein:
    the dummy via contact includes a first dummy via contact and a second dummy via contact, and
    the first dummy via contact and the second dummy via contact are provided on the dummy impurity diffusion region and connected to the dummy metal interconnect.

4. The layout structure of a standard cell of claim 1, wherein the dummy gate electrode is disposed between the transistor of the logic circuit and the dummy impurity diffusion region.

5. The layout structure of a standard cell of claim 1, wherein the second power potential is different from the first power potential.

6. The layout structure of a standard cell of claim 1, wherein the logic circuit includes at least one of an inverter circuit, a NAND circuit and a NOR circuit.

7. A standard cell, comprising the layout structure of claim 1.

8. A semiconductor integrated circuit, comprising:
    a plurality of standard cells, at least one of which includes the layout structure of claim 1.

* * * * *